United States Patent
Tokiwa

(10) Patent No.: US 8,339,853 B2
(45) Date of Patent: *Dec. 25, 2012

(54) NONVOLATILE SEMICONDUCTOR STORAGE DEVICE, NONVOLATILE SEMICONDUCTOR STORAGE SYSTEM AND METHOD OF MANAGING OF DEFECTIVE COLUMN IN NONVOLATILE SEMICONDUCTOR STORAGE SYSTEM

(75) Inventor: Naoya Tokiwa, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/353,047

(22) Filed: Jan. 18, 2012

(65) Prior Publication Data

US 2012/0113719 A1 May 10, 2012

Related U.S. Application Data

(60) Continuation of application No. 12/957,466, filed on Dec. 1, 2010, now Pat. No. 8,120,957, which is a continuation of application No. 12/767,847, filed on Apr. 27, 2010, now Pat. No. 7,864,580, which is a division of application No. 12/040,155, filed on Feb. 29, 2008, now Pat. No. 7,724,573.

(30) Foreign Application Priority Data

Mar. 2, 2007 (JP) ................................ 2007-053358

(51) Int. Cl.
*G11C 11/34* (2006.01)
*G11C 16/04* (2006.01)

(52) U.S. Cl. ..................... 365/185.09; 365/200; 365/201

(58) Field of Classification Search ............. 365/185.09, 365/200, 201
See application file for complete search history.

(56) References Cited

U.S. PATENT DOCUMENTS

| 5,903,495 A * | 5/1999 | Takeuchi et al. ......... 365/185.03 |
| 6,046,935 A * | 4/2000 | Takeuchi et al. ......... 365/185.03 |
| 6,462,985 B2 | 10/2002 | Hosono et al. |

(Continued)

FOREIGN PATENT DOCUMENTS

JP 2000-163988 6/2000

(Continued)

OTHER PUBLICATIONS

Office Action issued Oct. 31, 2011 in Taiwanese Patent Application No. 097107227, pp. 1-7.

(Continued)

*Primary Examiner* — Anh Phung
(74) *Attorney, Agent, or Firm* — Oblon, Spivak, McClelland, Maier & Neustadt, L.L.P.

(57) ABSTRACT

A nonvolatile semiconductor storage device is disclosed, which includes a memory cell array in which nonvolatile memory cells are arranged, a first data holding circuit which temporarily holds a collective processing unit of read or write data to be simultaneously read from or written to the memory cells, a circuit which takes out the data held in the first data holding circuit from the device, and a second data holding circuit in which data is automatically set at a time when power supply is turned on and in which the data is changeable based on a command input to the device, wherein the collective processing unit is equal to a sum of the number of units used within the device and the maximum number of units continuously output from the device to outside or input to the device from outside.

20 Claims, 22 Drawing Sheets

U.S. PATENT DOCUMENTS

| | | | |
|---|---|---|---|
| 6,507,518 | B2 | 1/2003 | Hosono et al. |
| 6,657,896 | B2 | 12/2003 | Hosono et al. |
| 6,704,223 | B2 | 3/2004 | Hosono et al. |
| 6,831,859 | B2 | 12/2004 | Hosono et al. |
| 6,859,401 | B2 | 2/2005 | Hosono et al. |
| 7,110,294 | B2 | 9/2006 | Kawai |
| 7,126,851 | B2 | 10/2006 | Hosono et al. |
| 7,170,802 | B2 | 1/2007 | Cernea et al. |
| 7,277,325 | B2 | 10/2007 | Fukuda et al. |
| 7,286,400 | B2 | 10/2007 | Kojima et al. |
| 7,286,420 | B2 | 10/2007 | Kawai |
| 7,366,042 | B2 | 4/2008 | Sukegawa |
| 7,423,904 | B2 | 9/2008 | Kojima |
| 7,463,515 | B2 | 12/2008 | Shirakawa et al. |
| 7,590,006 | B2 | 9/2009 | Tokiwa |
| 7,937,523 | B2 * | 5/2011 | Tsuji ............................ 711/103 |
| 2004/0042331 | A1 | 3/2004 | Ikehashi et al. |
| 2004/0062099 | A1 | 4/2004 | Hosono et al. |
| 2006/0018157 | A1 | 1/2006 | Kawai |
| 2006/0050564 | A1 | 3/2006 | Komija et al. |
| 2006/0198191 | A1 * | 9/2006 | Nakai ...................... 365/185.13 |
| 2006/0245259 | A1 | 11/2006 | Fukuda et al. |
| 2007/0016738 | A1 | 1/2007 | Hosono et al. |
| 2007/0223292 | A1 | 9/2007 | Moogat et al. |
| 2008/0043550 | A1 | 2/2008 | Kawai |
| 2011/0002169 | A1 | 1/2011 | Li et al. |

FOREIGN PATENT DOCUMENTS

| | | |
|---|---|---|
| JP | 2001-176290 | 6/2001 |
| JP | 2001-250395 | 9/2001 |
| JP | 2002-109893 | 4/2002 |
| JP | 2002-133894 | 5/2002 |
| JP | 2002-140899 | 5/2002 |
| JP | 2002-150789 | 5/2002 |
| JP | 2003-109396 | 4/2003 |
| JP | 2006-79695 | 3/2006 |
| JP | 2006-331611 | 12/2006 |
| JP | 2007-18557 | 1/2007 |
| KR | 2006-113490 | 11/2006 |

OTHER PUBLICATIONS

Office Action issued Dec. 13, 2011 in Japanese Application No. 2007-053358 filed Mar. 2, 2007 (w/English translation).

* cited by examiner

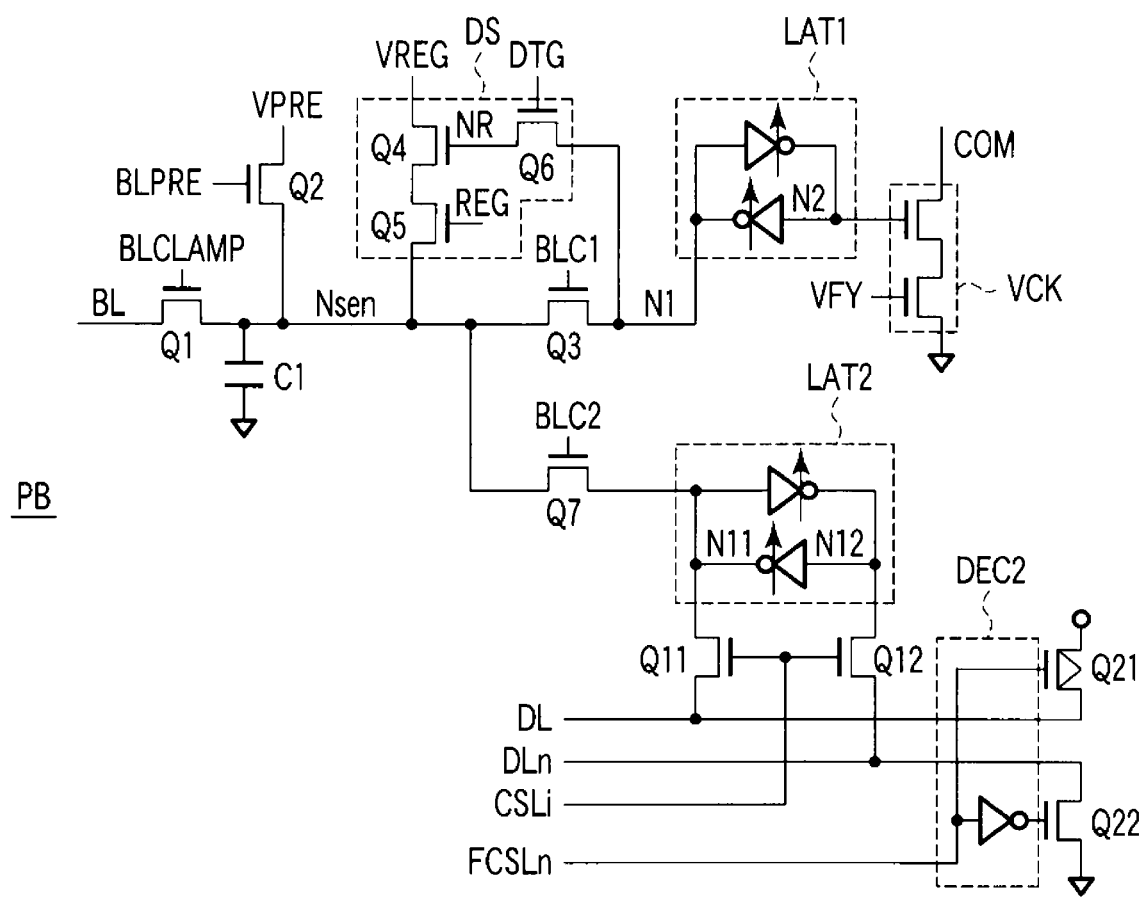
F I G. 4

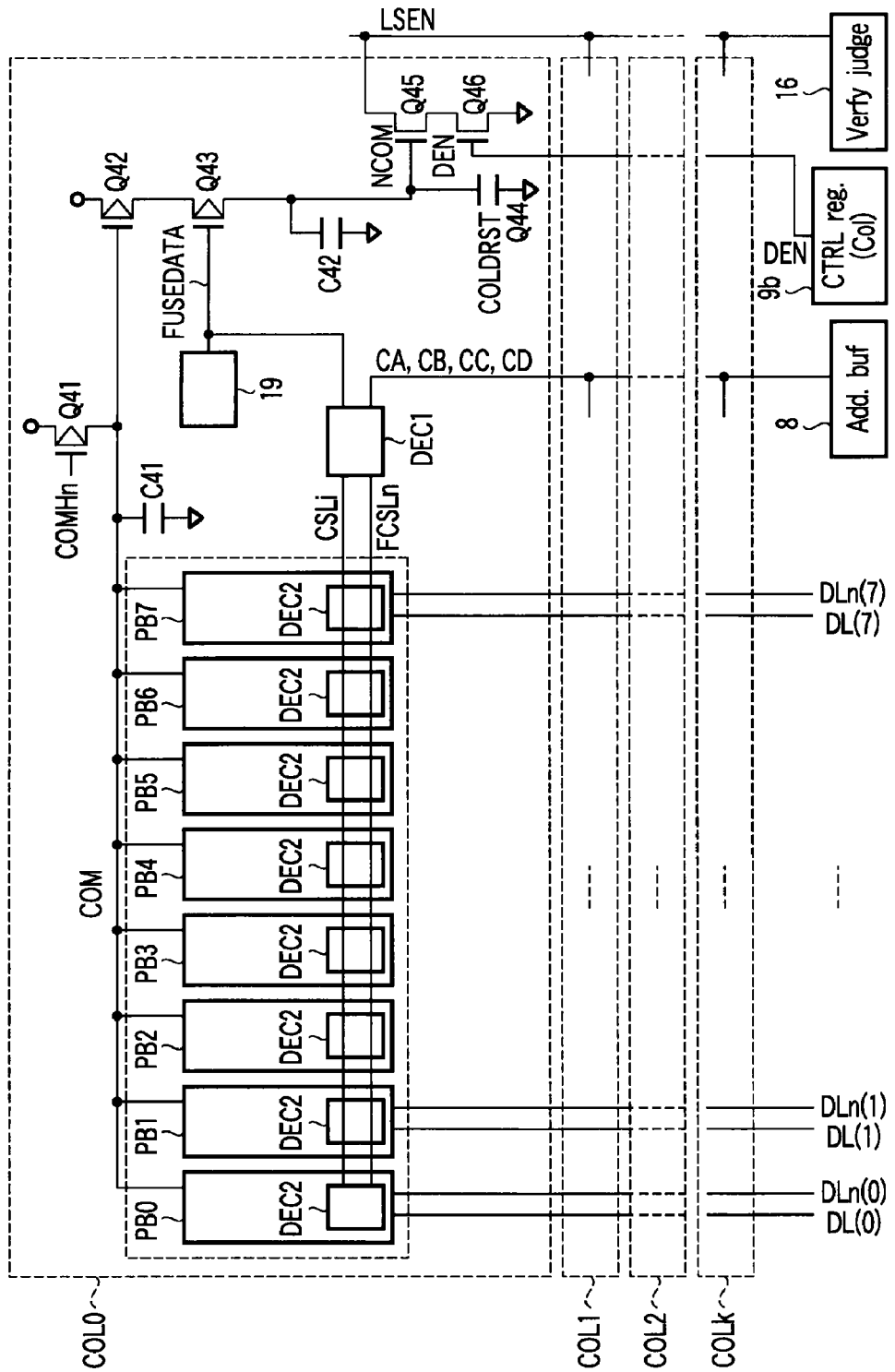
F I G. 5

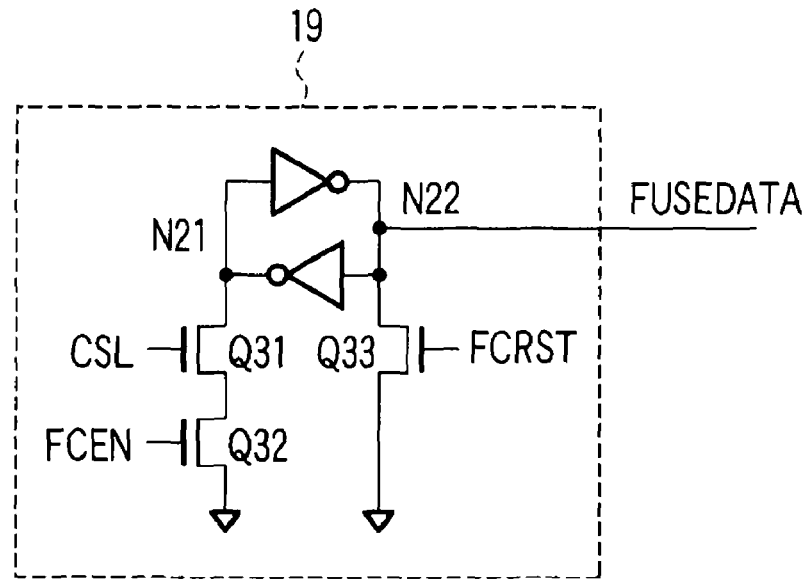
F I G. 6
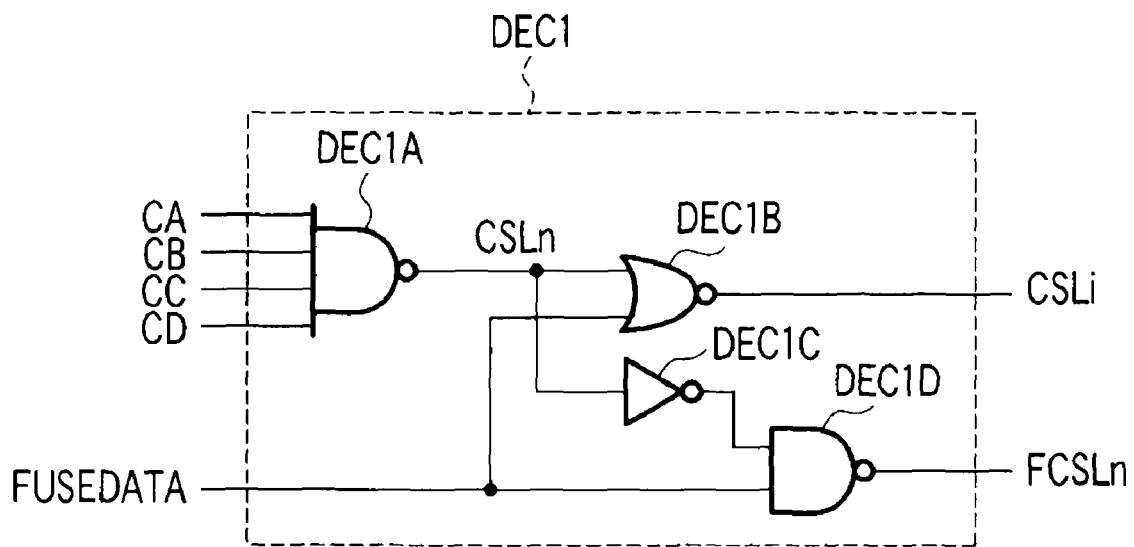
F I G. 7

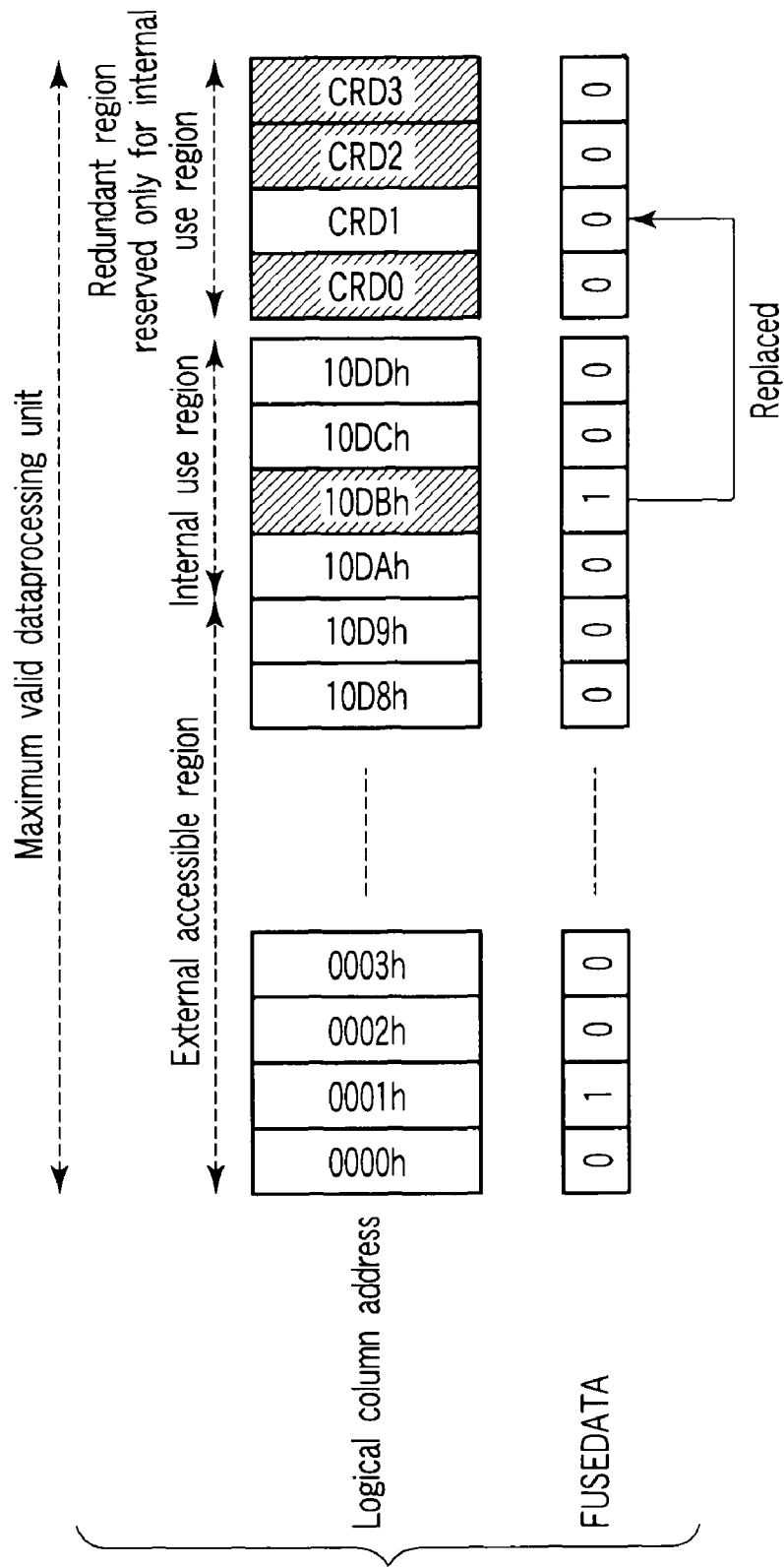
F I G. 10

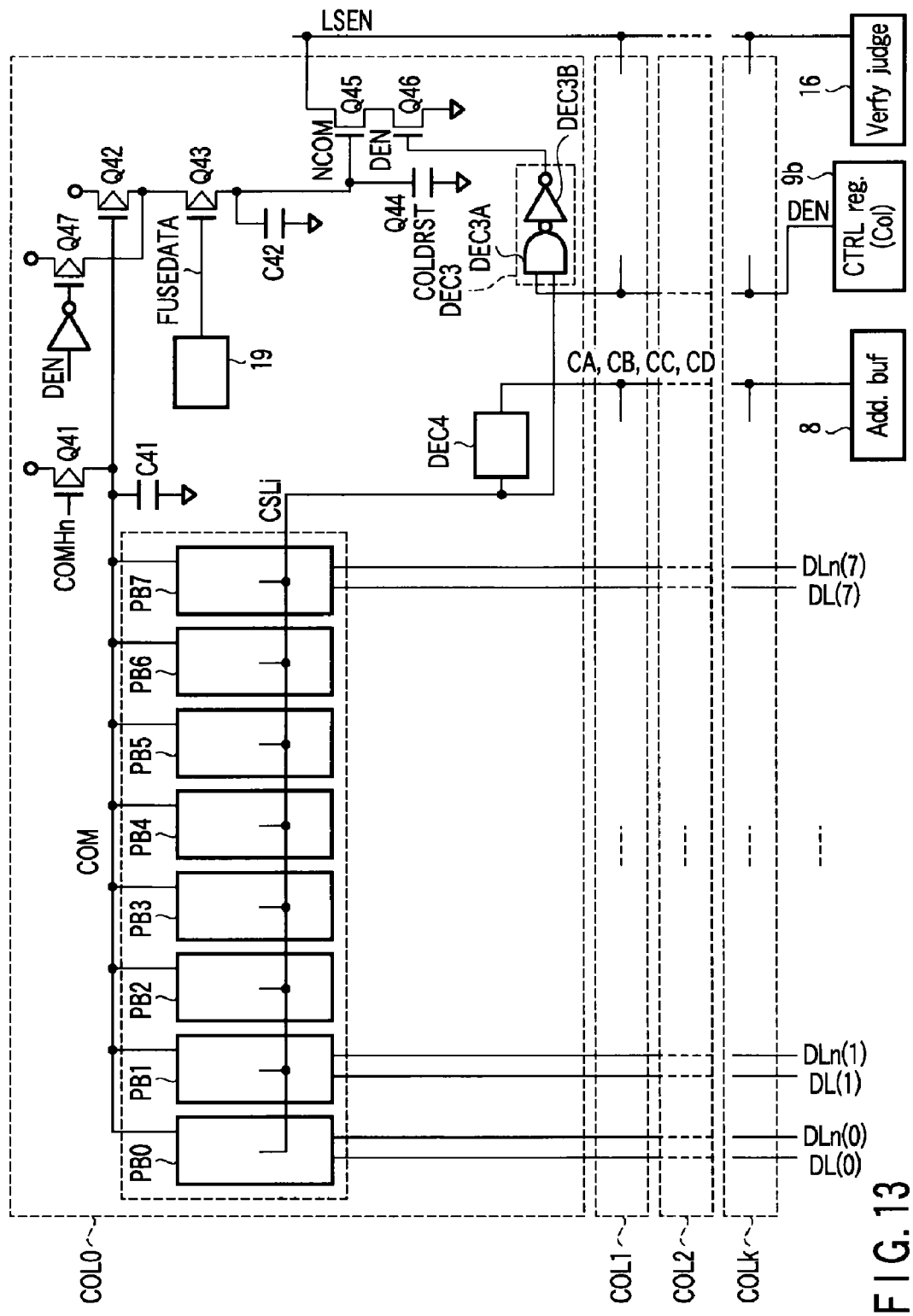
F I G. 13

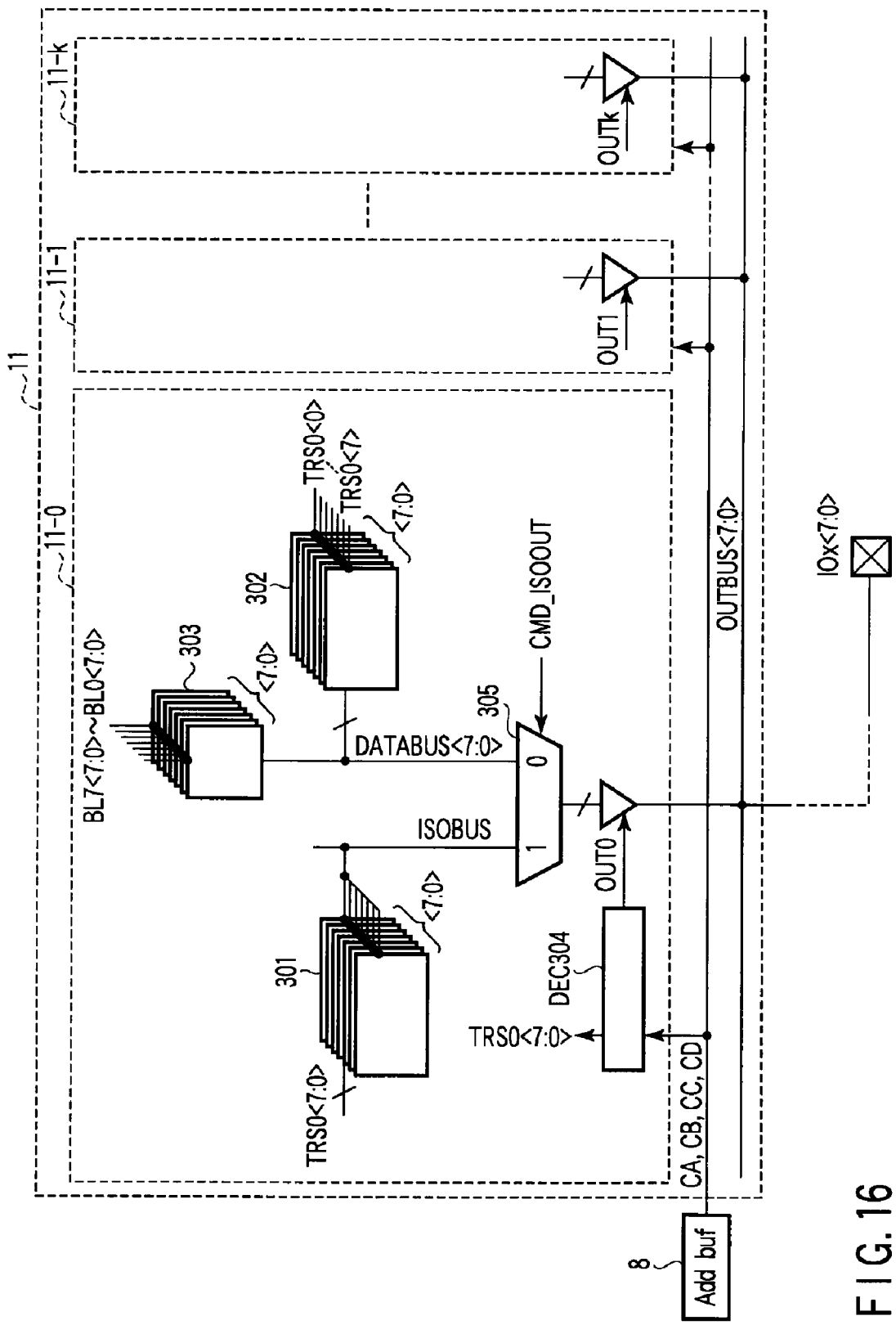
F I G. 16

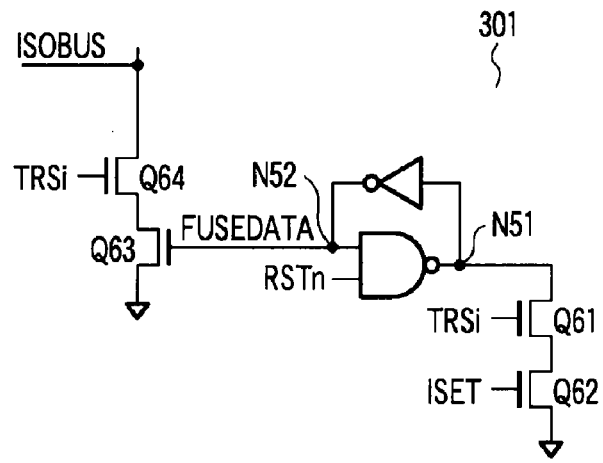
F I G. 17
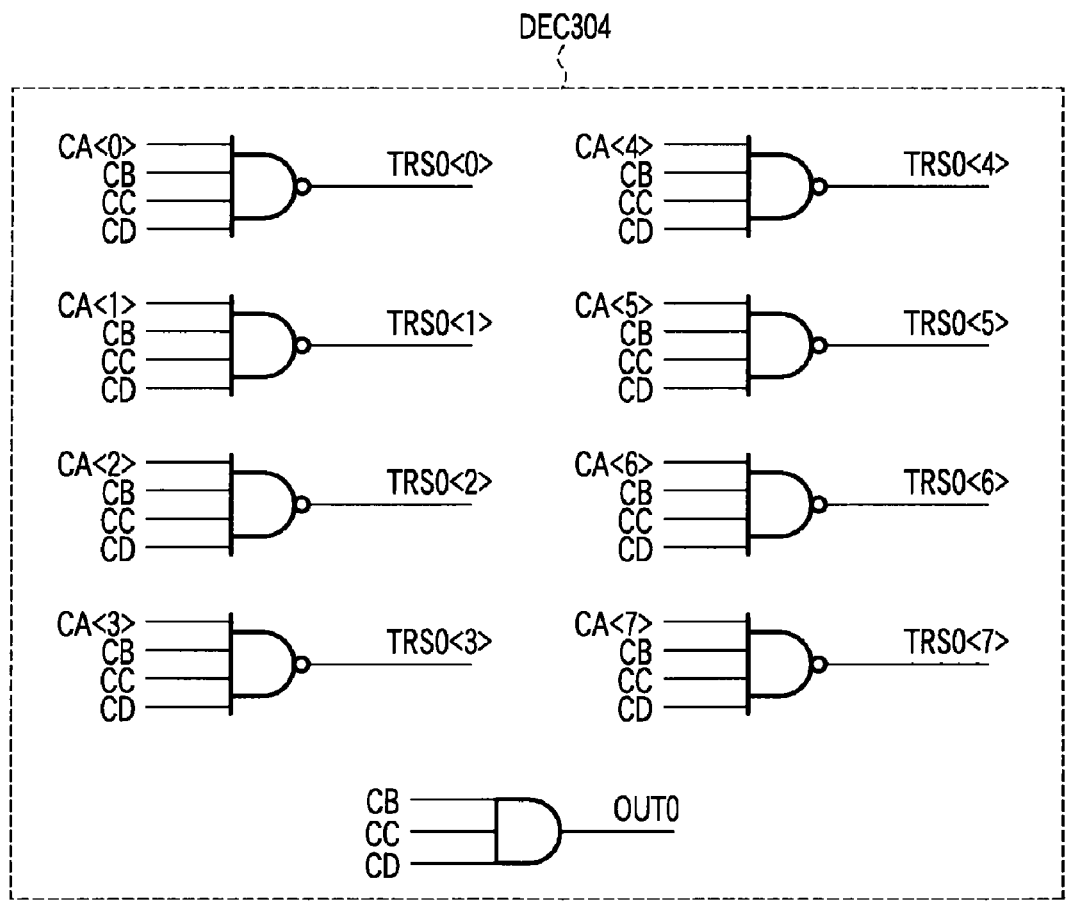
F I G. 18

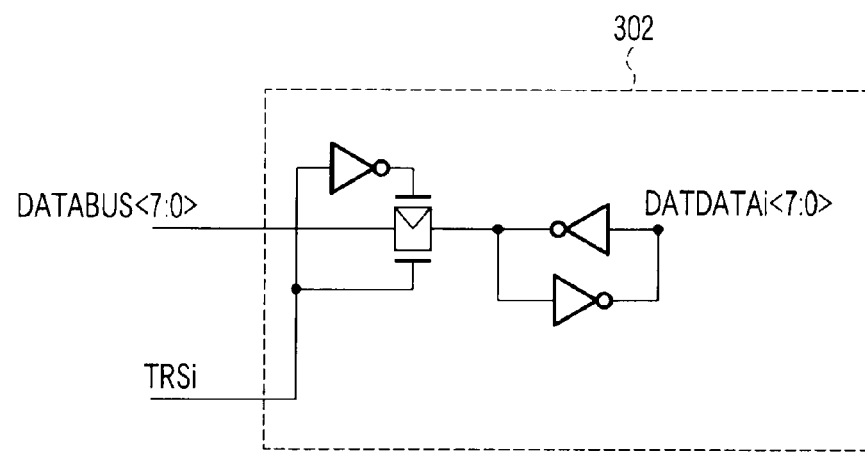
F I G. 19
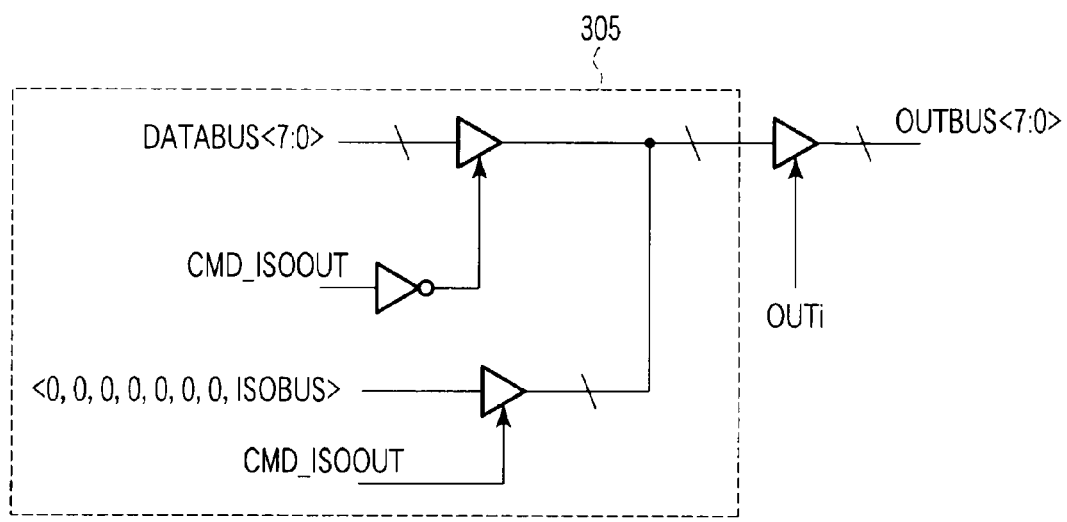
F I G. 20

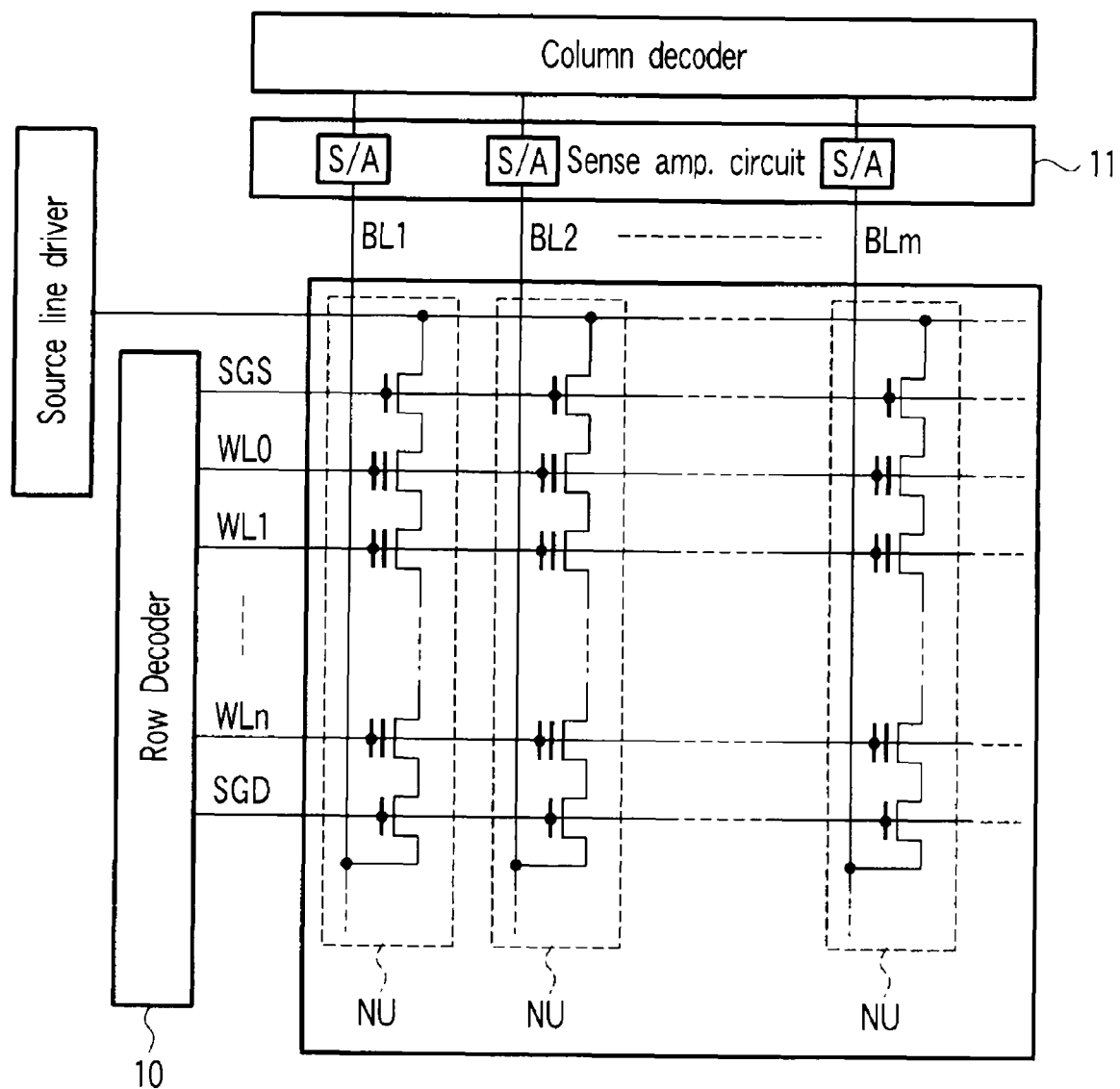
F I G. 21

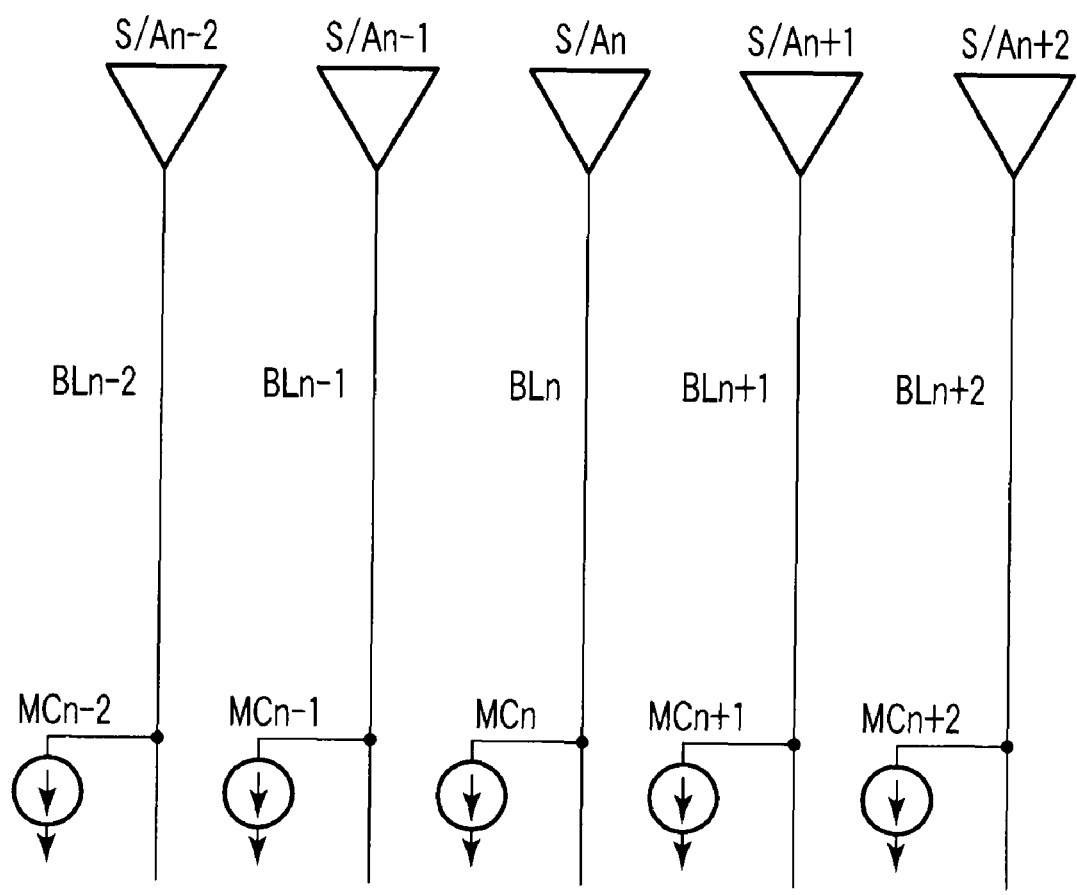
F I G. 22

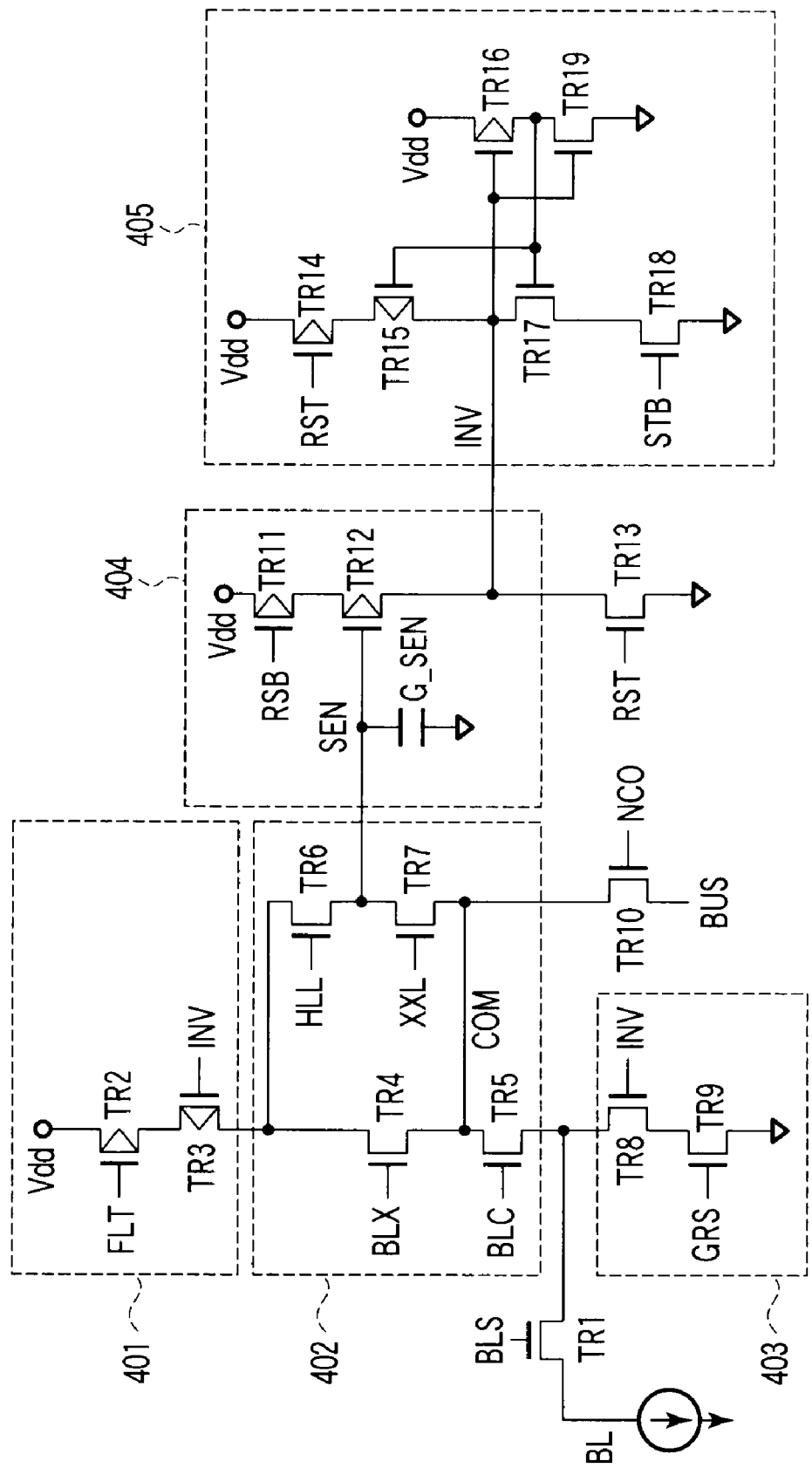
F I G. 23

NONVOLATILE SEMICONDUCTOR STORAGE DEVICE, NONVOLATILE SEMICONDUCTOR STORAGE SYSTEM AND METHOD OF MANAGING OF DEFECTIVE COLUMN IN NONVOLATILE SEMICONDUCTOR STORAGE SYSTEM

CROSS-REFERENCE TO RELATED APPLICATIONS

This application is a continuation of and claims the benefit of priority under 35 U.S.C. §120 from U.S. Ser. No. 12/957,466 filed Dec. 1, 2010 (now U.S. Pat. No. 8,120,957 issued Feb. 21, 2012), which is a continuation of U.S. Ser. No. 12/767,847 filed Apr. 27, 2010 (now U.S. Pat. No. 7,864,580 issued Jan. 4, 2011), which is division of U.S. Ser. No. 12/040,155 filed Feb. 29, 2008 (now U.S. Pat. No. 7,724,573 issued May 25, 2010), and claims the benefit of priority under 35 U.S.C. §119 from Japanese Patent Application No. 2007-053358 filed Mar. 2, 2007, the entire contents of each of which are incorporated herein by reference.

BACKGROUND OF THE INVENTION

1. Field of the Invention

The present invention relates to a nonvolatile semiconductor storage device. More particularly, it relates to a defective column management technique of an electrically rewritable nonvolatile semiconductor storage device.

2. Description of the Related Art

Heretofore, as one of electrically rewritable nonvolatile semiconductor storage devices, a NAND flash memory is known. In the NAND flash memory, in order to repair a defect of a memory cell generated during manufacturing steps, a redundant column repair system (flexible column-redundancy) is incorporated in the NAND flash memory, which automatically replaces a defective column with a redundant column. In the redundant column repair system, it is detected whether or not an input column address coincides with a defective column address. When the input column address coincides with the defective column address, a column to be accessed is changed (e.g., see Jpn. Pat. Appln. KOKAI Publication No. 2001-250395).

In a defect address storage circuit, a fuse circuit or a ROM circuit is usually used. However, another system including no such a circuit has been proposed, in which a defect address is stored together with other various initial setting data in a memory cell array (e.g., see Jpn. Pat. Appln. KOKAI Publication No. 2001-176290). In this case, when power supply is turned on, the defect address is automatically read out and transferred to an initial setting register. In the subsequent operation, replacement of the defective column is carried out based on the defect address held in the initial setting register.

Moreover, in a data write sequence in the NAND flash memory, write potential application and write verification are repeatedly performed. That is, after verification reading, verification judgment (pass/failure judgment) is performed to check whether or not the writing of all the data has been completed. In a case where it is judged that the writing of all the bits has been completed, the write sequence ends. In a case where it is judged that an insufficiently written bit is present, the write potential is applied again.

A maximum number Nmax of the application times of the write potential (a write cycle number or a loop number) is preset. Even in a case where the number of writes reaches Nmax, when the writing of all the bits does not end, the write is regarded as a "failure", so that the write sequence ends.

When the verification judgment is performed on a column including a defective memory cell, the writing is repeated until the number of writing reaches the maximum number Nmax, since the writing of the defective memory cell is not completed. After the writing of the maximum number Nmax, the judgment results in the "failure". Therefore, time for the write sequence increases. To solve the problem, there has been a further proposal in which a verification judgment circuit is provided with a latch circuit to hold data for separating the defective column and in which the defective column is excluded from a judgment target of the verification judgment (e.g., see Jpn. Pat. Appln. KOKAI Publication No. 2002-140899).

Furthermore, there has been a further proposal including a latch circuit to which defective column separation data can be written in accordance with a command input from the outside a semiconductor chip in order to repair the NAND flash memory from a defect generated during use of the memory (e.g., see Jpn. Pat. Appln. KOKAI Publication No. 2006-79695).

In the redundant column repair system, however, a comparison circuit provided in the NAND flash memory detects whether or not the input column address agrees with the defective column address every time required, and the replacement for changing the column to be accessed is performed. This is a factor disturbing a high-rate operation.

Moreover, in a case where no defective column is present in the memory device, or only defective columns fewer than the pre-mounted redundant columns are present, the device is shipped with the unused redundant columns. In this case, although the columns are normal as memory cells, an unused area where data cannot be written from the outside or inside of the chip is present. This cannot be recognized that the memory cells are effectively used, which reduces convenience.

BRIEF SUMMARY OF THE INVENTION

According to a first aspect of the present invention, there is provided a nonvolatile semiconductor storage device comprising:
a memory cell array in which a plurality of electrically rewritable nonvolatile memory cells are arranged;
a first data holding circuit which temporarily holds a collective processing unit of read or write data to be simultaneously read from or written to the memory cells;
a circuit which takes out the data held in the first data holding circuit from the device to outside; and
a second data holding circuit in which data is automatically set at a time when power supply is turned on and in which the data is changeable based on a command input to the device from outside,
wherein the collective processing unit is equal to a sum of the number of units used within the device and the maximum number of units continuously output from the device to outside or input to the device from outside.

According to a second aspect of the present invention, there is provided a nonvolatile semiconductor storage device comprising:
a memory cell array in which a plurality of electrically rewritable nonvolatile memory cells are arranged;
a first data holding circuit which temporarily holds a collective processing unit of read or write data to be simultaneously read from or written to the memory cells;
a circuit which takes out the data held in the first data holding circuit to outside of the device; and a second data holding circuit in which data is automatically set at a time when power supply is turned on and in which the data is changeable based on a command input from outside of the device, wherein the collective processing unit is more than a sum of the number of units used within the device and the maximum number of units continuously output from the device to outside or input to the device from outside and less than a sum of the number of the units used within the device, the maximum number of the units continuously output from the device to outside or input to the device from outside and the number of units of redundant regions which is at most equal in numbers to the number of units used within the device.

According to a third aspect of the present invention, there is provided a method of managing a defective column in a nonvolatile semiconductor storage system, comprising:

supplying power to a nonvolatile semiconductor storage system including a nonvolatile semiconductor memory to start up the nonvolatile semiconductor memory;

detecting the supply of power and reading defective column address data held in a memory cell array of the nonvolatile semiconductor memory to hold the read address data as defective column separation data in a holding circuit;

initializing a data latch circuit for holding data in units of page to set the data latch circuit at first data;

inputting a defective column information output command from a memory controller to the nonvolatile semiconductor memory to start an output operation of the defective column information in the nonvolatile semiconductor memory;

reading data for one column via a data line;

judging whether the column of the read data is a normal column or a defective column;

updating a defective column management table when the column is a defective column;

judging, when the column is not a defective column, whether or not the column address is the final column address, and judging, when the column is a defective column, after updating the defective column management table, whether or not the column address is the final column address;

incrementing the column address when the column address is not the final column address, and reading data for a next one column in sequence and judging whether or not the column address is the final column address; and ending the defective column information output operation at a time when the column address is judged to be the final column address.

BRIEF DESCRIPTION OF THE SEVERAL VIEWS OF THE DRAWING

FIG. 4 is a circuit diagram showing a page buffer of the NAND flash memory in the nonvolatile semiconductor storage system according to the first embodiment of the present invention;

FIG. 5 is a circuit diagram showing a sense amplifier circuit of the NAND flash memory in the nonvolatile semiconductor storage system according to the first embodiment of the present invention;

FIG. 6 is a circuit diagram showing a column separation data holding circuit of the NAND flash memory in the nonvolatile semiconductor storage system according to the first embodiment of the present invention;

FIG. 7 is a circuit diagram showing a decoder circuit of the NAND flash memory in the nonvolatile semiconductor storage system according to the first embodiment of the present invention;

FIG. 10 is a schematic diagram showing the a defect management system within a page in the nonvolatile semiconductor storage system according to the first embodiment of the present invention;

FIG. 13 is a circuit diagram showing a sense amplifier circuit of the NAND flash memory in the nonvolatile semiconductor storage system according to the second embodiment of the present invention;

FIG. 16 is a block diagram showing a functional block structure of a nonvolatile semiconductor storage system associated with column separation data output, according to a third embodiment of the present invention;

FIG. 17 shows a structural example of a column separation data holding circuit used in the nonvolatile semiconductor storage system according to the third embodiment of the present invention;

FIG. 18 shows a structure of a decoder circuit used in the nonvolatile semiconductor storage system according to the third embodiment of the present invention;

FIG. 19 shows a structure a data buffer circuit used in the nonvolatile semiconductor storage system according to the third embodiment of the present invention;

FIG. 20 shows a structure a bus selection circuit used in the nonvolatile semiconductor storage system according to the third embodiment of the present invention;

FIG. 21 is a block diagram of a memory cell array and a peripheral circuit including a sense amplifier circuit used in the nonvolatile semiconductor storage system according to the third embodiment of the present invention;

FIG. 22 shows a schematic correspondense between the sense amplifier circuits and the bit lines in the nonvolatile semiconductor storage system according to the third embodiment of the present invention;

FIG. 23 shows a circuit structure of one sense amplifier S/A of the sense amplifier circuit shown in FIG. 21;

DETAILED DESCRIPTION OF THE INVENTION

Embodiments of the present invention will hereinafter be described with reference to the drawings.

First Embodiment

Figure 1:
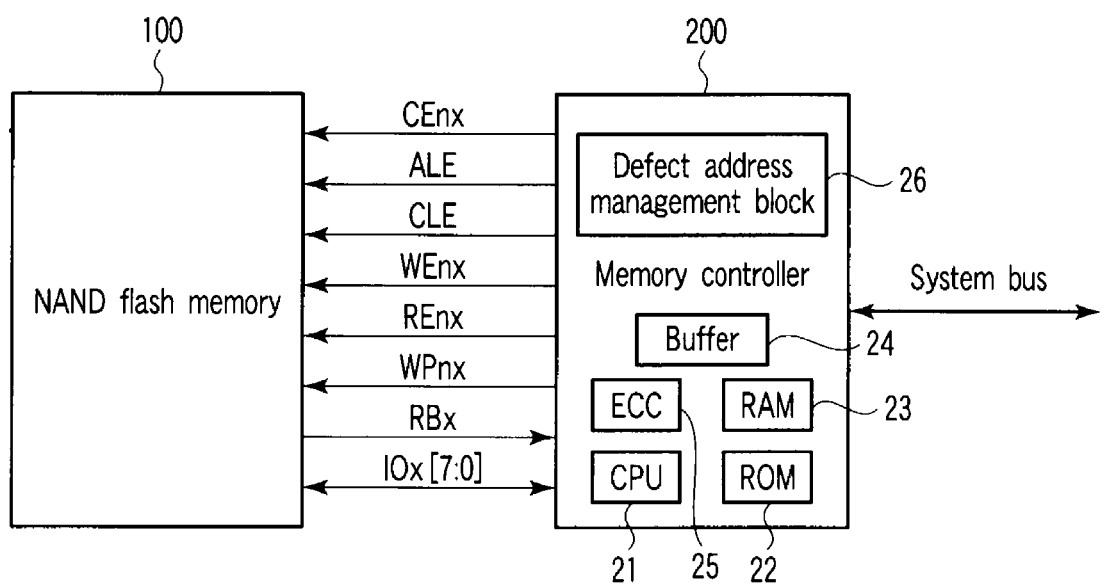
FIG. 1 is a block diagram showing a structure of a nonvolatile semiconductor storage system according to a first embodiment of the present invention.

FIG. 1 is a block diagram showing a structure of a nonvolatile semiconductor storage system according to a first embodiment of the present invention. The nonvolatile semiconductor storage system has a NAND flash memory 100 and a memory controller 200.

As shown in FIG. 1, the memory controller 200 has a central processing unit (CPU) 21, a read only memory (ROM) 22, a random access memory (RAM) 23, a buffer 24, an error checking and correction (ECC) circuit 25, and a defect address management block 26. In accordance with a request from a system such as an external host apparatus, the memory controller accesses the NAND flash memory 100 to control writing, reading, erasing and the like of data.

The CPU 21 controls an operation of the whole nonvolatile semiconductor storage system. When the nonvolatile semiconductor storage system receives power supply, the CPU reads, onto the RAM 23, firmware stored in the ROM 22 to execute predetermined processing.

The ROM 22 stores the firmware and the like to be controlled by the CPU 21, and the RAM 23 is used as a working area of the CPU 21.

The buffer 24 temporarily stores a constant amount of data, when the data transferred from the external host apparatus or the like is written to the NAND flash memory 100, and the buffer temporarily stores the constant amount of the data, when the data read from the NAND flash memory 100 is transferred to the external host apparatus or the like.

When data is written in the NAND flash memory 100, the ECC circuit 25 generates an ECC code based on write data input from the external host apparatus or the like into the memory controller 200 to apply the ECC code to the data. Also, when data is read out from the NAND flash memory 100, the ECC circuit 25 compares an ECC code generated based on the read data with the ECC code applied at the time of writing to detect or correct an error.

The defect address management block 26 is constituted based on defective column address information informed from the NAND flash memory 100, to manage the defective column address information. A defective column address will be described later.

Figure 2:
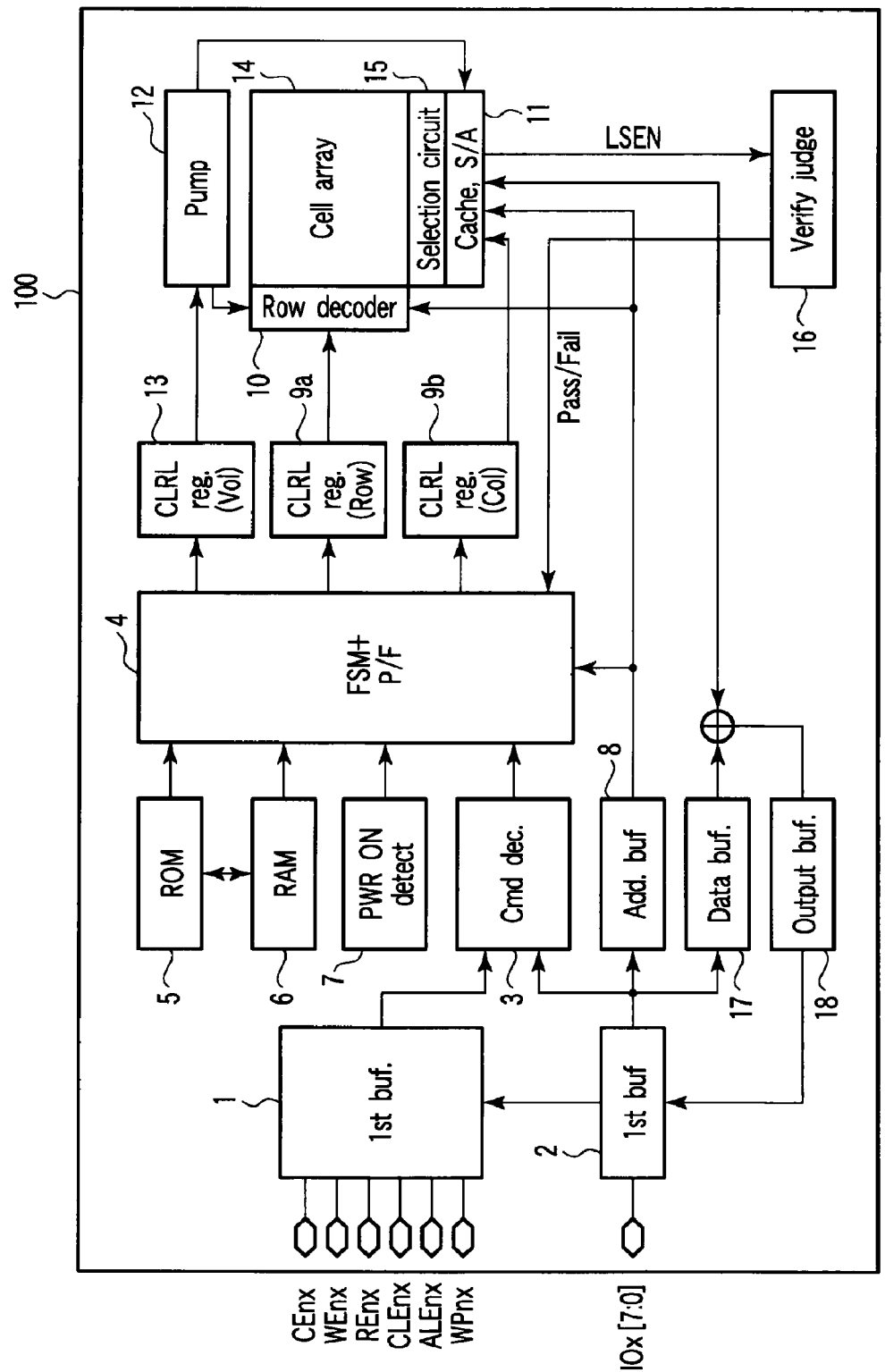
FIG. 2 is a block diagram showing a structure of a NAND flash memory in the nonvolatile semiconductor storage system according to the first embodiment of the present invention.
Figure 3:
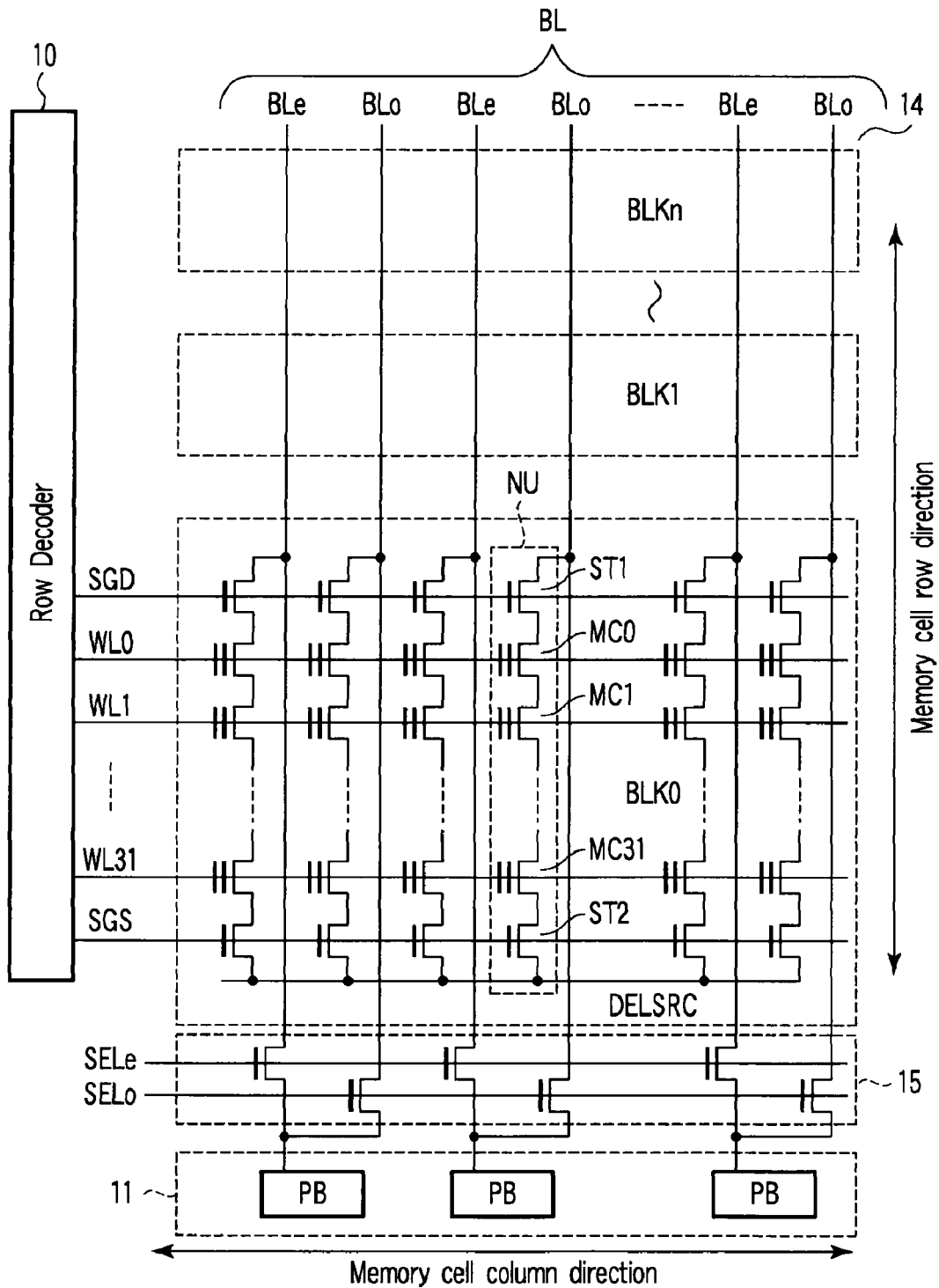
FIG. 3 is a cell array diagram of a memory core section of the NAND flash memory in the nonvolatile semiconductor storage system according to the first embodiment of the present invention.

Next, a structure of the NAND flash memory 100 will be described. FIG. 2 shows a functional block structure of the NAND flash memory 100, and FIG. 3 shows a cell array structure of a memory core section.

The NAND flash memory 100 has an input buffer 1, an input buffer 2, a command decoder 3, a state machine 4, a ROM 5, a RAM 6, a power-on detection circuit 7, an address buffer 8, a control register 9a, a control register 9b, a row decoder 10, a sense amplifier circuit 11, a high-voltage generation circuit 12, a control register 13, a memory cell array 14, a selection circuit 15, a verification judgment circuit 16, a data buffer 17 and an output buffer 18.

External control signals such as a chip enable signal CEnx, a write enable signal WEnx, a read enable signal REnx, a command latch enable signal CLEx, an address latch enable signal ALEx and a write protect signal WPnx are input into the input buffer 1 via a control pin. A command, an address and data are input into the input buffer 2 via an input/output (I/O) pin.

Moreover, although not shown in FIG. 2, a status signal RBx indicates that the NAND flash memory 100 is in a ready or busy state with respect to write, read and erase operations and the like, and the signal can be output to the memory controller 200.

The command input from the input/output pin is transferred to the command decoder 3 via the input buffer 2, decoded by the command decoder 3, and then transferred to the state machine 4.

The state machine 4 is an internal control circuit of the NAND flash memory 100, and a part or all of control program of the circuit is held in the ROM 5 and the RAM 6. In a case where the nonvolatile semiconductor storage system receives power supply and the power-on detection circuit 7 detects that the power supply turns on, a part or all of the control program is transferred to the RAM 6. The state machine 4 controls various operations such as the writing, reading and erasing based on the control program transferred to the RAM 6, in accordance with the command input from the command decoder 3.

The address input from the input/output pin is input into the control registers 9a and 9b via the address buffer 8 at a timing predetermined by control of the state machine 4, and transferred to the row decoder 10 and the sense amplifier circuit 11.

The high-voltage generation circuit 12 is controlled based on a signal transmitted from the state machine 4 via the control register 13, to generate a high voltage required for various operations such as writing, reading and erasing.

As shown in FIG. 3, the memory cell array 14 is constituted by arranging NAND cell units (NAND strings) NU in which electrically rewritable nonvolatile memory cells MC0 to MC31 (hereinafter usually referred to as the memory cells MC) are connected in series.

Each memory cell MC has, for example, a floating gate electrode formed on a semiconductor substrate via a tunnel insulating film, and a control gate electrode laminated on the floating gate electrode via an inter-gate insulating film. The memory cell MC can hold, in a nonvolatile manner, one piece of data of four-value data "xy" which is defined by, for example, upper page data "x" and lower page data "y" and to which data "11", "10", "00" and "01" have been assigned in order of the threshold potential, by use of a change of a threshold potential due to the volume of a charge accumulated in the floating gate electrode.

One end of each NAND cell unit NU is connected to a bit line BL via a selection gate transistor ST1, and the other end thereof is connected to a common source line CELSRC via a selection gate transistor ST2. The control gate electrodes of the memory cells MC of the same row extend in a memory cell column direction and are connected in common to constitute word lines WL0 to WL31 (hereinafter usually referred to as the word lines WL). The control gate electrodes of the selection gate transistors ST1, ST2 extend in the memory cell column direction and are connected in common to constitute selection gate lines SGD, SGS.

A set of a plurality of NAND cell units NU arranged in the memory cell column direction constitutes a block BLK as a minimum unit of data erase, and a plurality of blocks BLK0 to BLKn are arranged in a memory cell row direction.

The row decoder 10 is disposed on the side of one end of each word line WL, and selectively drives the word line WL and the selection gate lines SGS and SGD in accordance with the address input from the control register 9a.

The sense amplifier circuit 11 is disposed on the side of one end of each bit line BL, for use in writing and reading the data. The sense amplifier circuit 11 also includes a plurality of page buffers PB, and is selectively connected, via the selection circuit 15, to one of a group of even-numbered bit lines BLe constituted of even-numbered bit lines BL counted from an end of the bit lines BL in the block BLK and a group of odd-numbered bit lines BLo constituted of odd-numbered bit lines BL.

The selection circuit 15 selects one of the two groups of the bit lines BLe, BLo to connect the group to the sense amplifier circuit 11. The selection circuit 15 does not select the other group of the two groups of the bit lines BLe, BLo, and does not connect the non-selected group to the sense amplifier circuit 11. During reading of the data, the bit lines BL on a non-selected side are grounded to reduce the coupling noise between the bit lines BL.

In this case, a set of memory cells MC selected by one word line WL and the even-numbered bit lines BLe constitutes one page which is a write or read unit, and a set of memory cells MC selected by one word line WL and the odd-numbered bit lines BLo constitutes another page.

The verification judgment circuit 16 is provided to the sense amplifier circuit 11, and performs a verification judgment operation described later based on the data held in a data latch LAT1 of the page buffer PB in the sense amplifier circuit 11 at the time of writing the data.

The write data is loaded on the sense amplifier circuit 11 via the data buffer 17, and the data read by the sense amplifier circuit 11 is output from the circuit via the output buffer 18.

FIG. 4 shows a structure example of one page buffer PB of the sense amplifier circuit 11. An NMOS transistor Q1 disposed between a sense node Nsen and the bit line BL is controlled based on a bit line control signal BLCLAMP, to perform a function of clamping a precharge potential of the bit line BL and a function of a pre-sense amplifier for amplifying the potential of the bit line BL. The sense node Nsen is connected to an NMOS transistor Q2 for precharge controlled based on a bit line precharge control signal BLPRE, and is, if necessary, connected to a capacitor C1 for storing charges.

The sense node Nsen is connected to one data node N1 of the data latch LAT1 via an NMOS transistor Q3 for transfer controlled based on a bit line control signal BLC1. A data storage circuit DS for temporarily storing the read data is provided between the data node N1 and the sense node Nsen. A gate of an NMOS transistor Q4 having a drain connected to a voltage terminal VREG is a data storage node NR.

An NMOS transistor Q6 for data transfer controlled based on a data transfer control signal DTG is disposed between the above storage node NR and the data node N1 of the data latch LAT1. Moreover, to transfer the voltage VREG to the sense node Nsen based on the data held in the storage node NR, an NMOS transistor Q5 controlled based on a voltage transfer control signal REG is disposed between the NMOS transistor Q4 and the sense node Nsen.

In the present embodiment, one data storage circuit DS is disposed, however, a plurality of data storage circuits may be arranged. The data storage circuit DS is used as a write-back circuit for holding the write data of the previous cycle at the time of writing, and writing "0" data back in the data node N1 of the data latch LAT1 only with respect to the memory cell MC in which it is determined by a verification judgment operation described later that "0" data is not sufficiently written.

On the other hand, the other data node N2 of the data latch LAT1 is connected to a first detection line COM via a verification check circuit VCK described later.

Moreover, the sense node Nsen is connected to a data latch LAT2 as a first data holding circuit which functions as a data cache, via an NMOS transistor Q7 for transfer controlled based on a bit line control signal BLC2. The write or read data for one page is simultaneously transferred between the data latch LAT1 and the data latch LAT2.

When the memory cell MC can hold the four-value data, the lower page data needs to be written with reference to, for example, the upper page data, or the upper page data needs to be written with reference to the lower page data.

For example, when the upper page data needs to be written with reference to the lower page, upper data to be written is held in the data latch LAT1. When the lower page data has already been written to the memory cell MC, this data is read and held in the data latch LAT2. Then, write verification control of the upper page data is performed with reference to this lower page data.

Data nodes N11, N12 of the data latch LAT2 are connected to complementary data lines DL, DLn via column selection gates Q11, Q12 controlled based on a column select signal CSLi. These complementary data lines DL, DLn are commonly connected to a pair of input/output terminals in the page, respectively, and a state of the data is judged by a differential amplifier.

The complementary data lines DL, DLn are connected to a PMOS transistor Q21 and an NMOS transistor Q22, respectively. A source of the PMOS transistor Q21 is connected to a power source potential Vdd, and a source of the NMOS transistor Q22 is connected to ground potential Vss. Gates of the PMOS transistor Q21 and the NMOS transistor Q22 are controlled by a decoder circuit DEC2, and constituted to turn on and off complementarily. The decoder circuit DEC2 is controlled based on an activation signal FCSLn described later.

FIG. 5 shows a structure of the sense amplifier circuit 11 which constitutes one page. Each of the page buffers PB holds the data of one bit and has one first detection lines COM, as shown in FIG. 4. The first detection lines COM of a unit of page buffers PB0 to PB7 (i.e., a byte unit) are commonly connected, thereby constituting one column. Logical level information of the first detection line COM is transmitted to a second detection line NCOM via PMOS transistors Q42 and Q43, and further transmitted to a third detection line LSEN via an NMOS transistor Q45. Logical level information of the third detection line LSEN is input into the verification judgment circuit 16, and informed to the state machine 4.

That is, a data line for the verification judgment has a hierarchical structure of the first detection line COM, the second detection line NCOM and the third detection line LSEN.

As shown in FIG. 4, the first detection line COM is connected to the data latch LAT1 via the verification check circuit VCK of each page buffer PB.

In the read for verification at the time of writing or erasing, when the write is completed, the held data is controlled so that all the data nodes N1 of the data latches LAT1 are brought into a "1" state. The first detection line COM detects the "1" state of all the data nodes N1 of the data latches LAT1 for each column unit.

The first detection line COM is precharged to the power source potential Vdd via a precharging PMOS transistor Q41 controlled based on a control signal COMHn. When the verification check circuit VCK is activated based on a verification signal VFY and even one of the data nodes N1 of the data latches LAT1 indicates data "0" (insufficient writing), the precharged first detection line COM is discharged. In this case, it is indicated that the write or the erase results in "fail", that is, the write or the erase is not completed.

The verification signal VFY shown in FIG. 4 is constituted so that, for example, all the verification check circuits VCK of eight page buffers PB are simultaneously activated. This mode is a case where pass/fail judgment is performed in units of column. However, when the pass/fail judgment is to be performed in units of bit, this verification signal VFY may successively be input into the individual page buffers PB to activate the page buffers, individually.

As shown in FIG. 5, the first detection line COM is connected to a gate of the PMOS transistor Q42 for detecting the level transition. A source of the PMOS transistor Q42 is connected to the power source potential Vdd, and a drain thereof is connected to the second detection line NCOM via the PMOS transistor Q43 controlled based on an FUSEDATA signal which is data held in one data node N22 of a column separation data holding circuit 19 as a second data holding circuit described later.

FIG. 6 is a circuit diagram showing an internal structure of the column separation data holding circuit 19. The column separation data holding circuit 19 is provided in order to exclude a defective column and the like from a target of the verification judgment, and defective column separation data is written with respect to the defective column in accordance with a test result before shipping. That is, the column separation data held in an initial setting data storage region of the memory cell array 14 is automatically read and written to the column separation data holding circuit 19, when power supply is turned on.

Moreover, the data held in the column separation data holding circuit 19 is rewritably constituted based on the command input from outside of the NAND flash memory 100, in order to exclude, from the target of the verification judgment, the defective column generated during use of the NAND flash memory 100 after shipment.

To make the rewriting possible, as shown in FIG. 6, between the other data node N21 of the column separation data holding circuit 19 and the ground potential Vss, an NMOS transistor Q31 controlled based on a column select signal CSL, and an NMOS transistor Q32 controlled based on an activation signal FCEN are connected in series. The data node N22 is connected to a reset NMOS transistor Q33 controlled based on a reset signal FCRST. It is to be noted that the column select signal CSL is different from a column select signal CSLi which is an output signal of a decoder circuit DEC1.

When a defective column is newly found by defect check performed by a predetermined sequence after the shipping, the column separation data is written to the column separation data holding circuit 19 in accordance with predetermined command input, in order to exclude this column from the verification judgment target.

That is, the NMOS transistor Q31 is turned on in response to the column select signal CSL, and the NMOS transistor Q32 is turned on in response to the activation signal FCEN activated by the control register 9b (not shown), whereby the column separation data is latched which sets the data node N21 of the column separation data holding circuit 19 to "0" and the data node N22 to "1".

That is, the column separation data held in the column separation data holding circuit 19 is data which turns on the PMOS transistor Q43, that is, which sets the FUSEDATA signal to "0" in a normal column (the column which is not the defective column). On the other hand, in the defective column, the data turns off the PMOS transistor Q43, that is, sets the FUSEDATA signal to "1".

It is to be noted that the defect check after the shipping may be performed during an initial setting operation for starting the system, or performed based on predetermined command input at an arbitrary timing.

The second detection line NCOM is disposed so that a one-to-one correspondence is established with the first detection line COM, and the second detection line detects the level transition of the first detection line COM with respect to the normal column, and is connected to the ground potential Vss via a reset NMOS transistor Q44 controlled based on a reset signal COLDRST. The NMOS transistor Q44 turns on in response to the reset signal COLDRST, whereby the second detection line NCOM is reset to the ground potential Vss.

The second detection line NCOM is connected to a gate of the NMOS transistor Q45 for detecting the level transition, and a drain of the NMOS transistor Q45 is connected in common to the third detection line LSEN.

The third detection line LSEN is a collective detection line provided in order to detect the level transition of the second detection line NCOM in each column. An NMOS transistor Q46 controlled based on an activation signal DEN input from the control register 9b is connected to a source of the NMOS transistor Q45 in series to the NMOS transistor Q45.

During the verification judgment, when the insufficiently written memory cell MC is present and the precharged first detection line COM is discharged via the verification check circuit VCK, the first detection line COM transits to a logical low, and the corresponding PMOS transistor Q42 turns on.

Here, in the normal column, the PMOS transistor Q43 turns on, and the second detection line NCOM is charged via the PMOS transistors Q42 and Q43, and transits to a logical high. On the other hand, in the defective column, the PMOS transistor Q43 turns off, and the second detection line NCOM keeps an initial state of the logical low (is not charged) regardless of the level transition of the first detection line COM.

During the verification judgment operation, the NMOS transistor Q46 is always on. Therefore, when the second detection line NCOM indicates the transition to the logical high, the NMOS transistor Q45 turns on, and the third detection line LSEN is discharged. On the other hand, when the second detection line NCOM keeps the initial state of the logical low, the NMOS transistor Q45 turns off, and the third detection line LSEN is not discharged.

The verification judgment circuit 16 detects the transition of the logical level of the third detection line LSEN to perform the verification judgment. That is, when the third detection line LSEN is discharged and transits to the logical low, as a result of the verification judgment, "fail" is informed to the state machine 4. When the third detection line LSEN is not discharged and keeps the logical high, as a result of the verification judgment, "pass" is informed to the state machine 4.

Based on the result of the verification judgment, for example, when the result is the "fail", the state machine 4 judges conditions for applying the write potential again. Therefore, by providing the column separation data holding circuit 19, it is possible to forcibly have the result "pass" with respect to the defective column, that is, it is possible to exclude the column from the target of the verification judgment.

In the semiconductor storage system according to the present embodiment, the FUSEDATA signal as the data held in the one data node N22 of the column separation data holding circuit 19 is also input into the decoder circuit DEC1. In consequence, while minimizing enlargement of a circuit area, the defective column address information can be informed to the outside of the NAND flash memory 100, for example, to the memory controller 200. This respect will hereinafter be described in detail in consideration of an operation of the NAND flash memory 100.

FIG. 7 shows a relation between the decoder circuit DEC1 shown in FIG. 5 and the column select signal CSLi and the activation signal FCSLn which are input signals of the page buffer PB. In the present embodiment, the column separation data holding circuit 19 is disposed for each one-byte (one-column) unit, so that one decoder circuit DEC1 is similarly disposed for one column. Therefore, the column select signal CSLi and the activation signal FCSLn which are output signals of the decoder circuit DEC1 are input as common signals to the page buffer PB of the column.

The decoder circuit DEC1 has, as input signals, the FUSEDATA signal and column address pre-decode signals CA, CB, CC and CD generated from the address buffer. Here, all the column address pre-decode signals CA, CB, CC and CD of "1" are input only in a case where the column is selected. It is also constituted that when the column is not selected, "0" is input into at least one place.

In the decoder circuit DEC1, the column address pre-decode signals CA, CB, CC and CD are input into an NAND circuit DEC1A. An outputs signal CSLn of the NAND circuit DEC1A is input into an NOR circuit DEC1B and an inverter circuit DEC1C. An output signal of the inverter circuit DEC1C is input into an NAND circuit DEC1D.

The FUSEDATA signal is input into the NOR circuit DEC1B and the NAND circuit DEC1D. An output signal of the NOR circuit DEC1B is the column select signal CSLi, and an output signal of the NAND circuit DEC1D is the activation signal FCSLn.

For example, the write data held in the memory cell MC for each page unit is held in the data latch LAT2. In a case where the data is serially read from the NAND flash memory 100, the address buffer 8 changes an address counter constituted in the address buffer 8 in response to the read enable signal REnx, whereby the column address pre-decode signals CA, CB, CC and CD are generated, and a column address indicated by the address counter is accessed.

All the column address pre-decode signals CA, CB, CC and CD of "1" are input into the decoder circuit DEC1 in the column to be accessed. When the column is a normal column, the FUSEDATA signal indicates "0". Therefore, the column select signal CSLi as the output signal of the decoder circuit DEC1 indicates "1", and the activation signal FCSLn also indicates "1".

In this case, the column select signal CSLi is activated to turn on the NMOS transistors Q11, Q12, and the data held in the data latch LAT2 is allowed to be output. Moreover, the activation signal FCSLn is input into the decoder circuit DEC2, whereby both the PMOS transistor Q21 and the NMOS transistor Q22 are turned off.

On the other hand, when the column is a defective column, the FUSEDATA signal indicates "1". Therefore, the column select signal CSLi as the output signal of the decoder circuit DEC1 indicates "0", and the activation signal FCSLn also indicates "0".

In this case, the column select signal CSLi remains to be inactive, so that the NMOS transistors Q11, Q12 turn off, and the data held in the data latch LAT2 is not allowed to be output. The activation signal FCSLn is input into the decoder circuit DEC2, whereby both the PMOS transistor Q21 and the NMOS transistor Q22 turn on, and the complementary data lines DL, DLn are forcibly fixed regardless of the data held in the data latch LAT2. Therefore, in the defective column, the complementary data lines DL, DLn always output stationary data.

Furthermore, in a case where program data is loaded so that, for example, the write data from outside the NAND flash memory 100 is input into the data latch LAT2 in units of one-byte, the address buffer 8 changes the address counter constituted in the address buffer 8 in response to the write enable signal WEnx, whereby the address pre-decode signals CA, CB, CC and CD are generated, and an column address indicated by the address counter is accessed.

All the column address pre-decode signals CA, CB, CC and CD of "1" are input into the decoder circuit DEC1 in the column to be accessed. When the column is a normal column, the FUSEDATA signal indicates "0". Therefore, the column select signal CSLi as the output signal of the decoder circuit DEC1 indicates "1", and the activation signal FCSLn also indicates "1".

In this case, the column select signal CSLi is activated to turn on the NMOS transistors Q11, Q12, and the data is allowed to be input into the data latch LAT2. Moreover, the activation signal FCSLn is input into the decoder circuit DEC2, whereby both the PMOS transistor Q21 and the NMOS transistor Q22 are turned off.

On the other hand, when the column is a defective column, the FUSEDATA signal indicates "1". Therefore, the column select signal CSLi as the output signal of the decoder circuit DEC1 indicates "0", and the activation signal FCSLn also indicates "0". In this case, the column select signal CSLi remains to be inactive, so that the data input into the data latch LAT2 is not allowed. Therefore, the data held in the data latch LAT2 is not changed.

Figure 8:
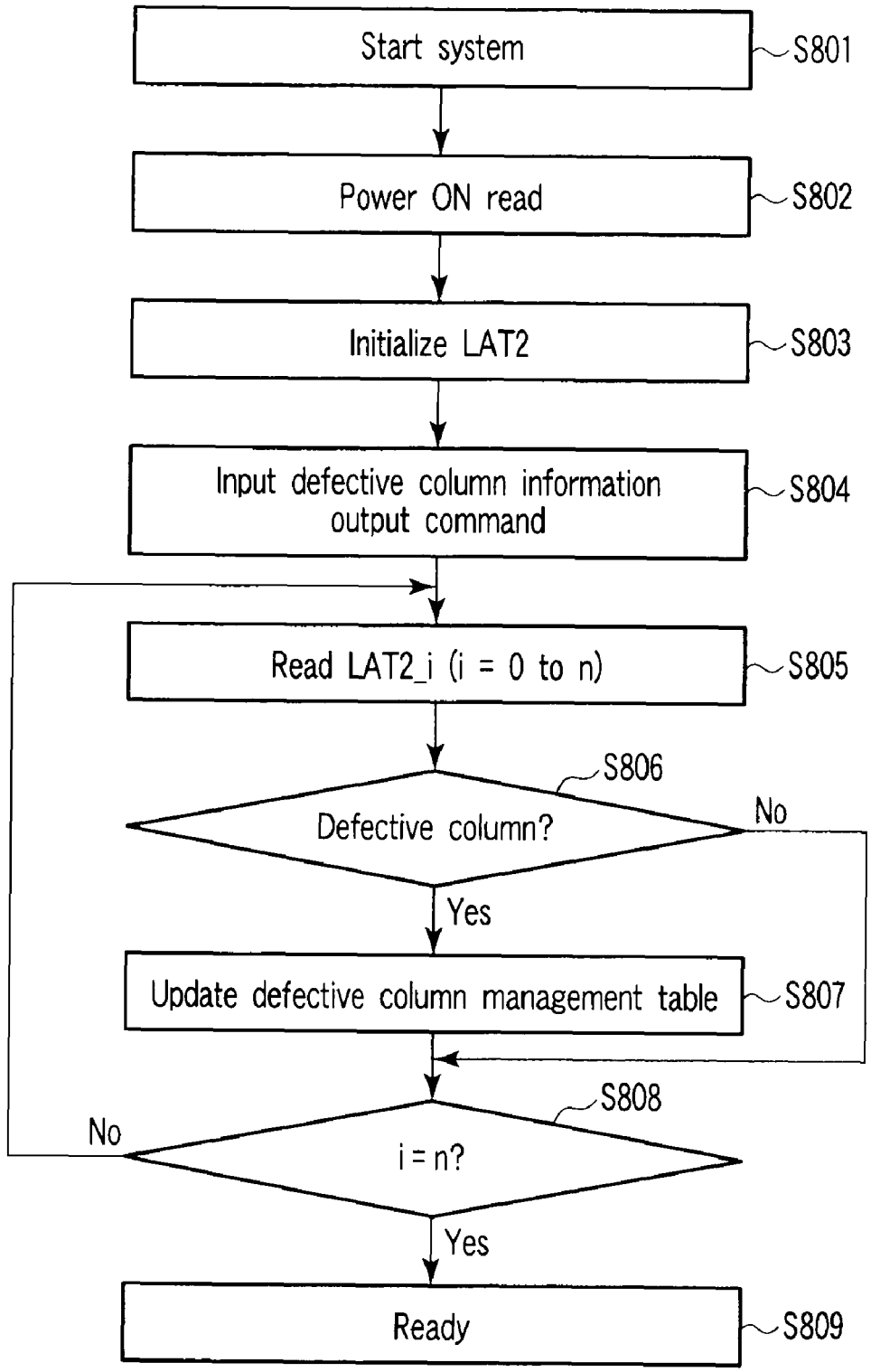
FIG. 8 is a circuit diagram showing a defective column detection sequence of the NAND flash memory in the nonvolatile semiconductor storage system according to the first embodiment of the present invention.

In the semiconductor storage system according to the present embodiment, by use of the above-mentioned structure and operation, defective column information is informed to the memory controller 200 by a sequence shown in FIG. 8 at the start of the semiconductor storage system. FIG. 8 is a flow chart showing a defective column information output operation.

First, when power is supplied to the nonvolatile semiconductor storage system, the power-on detection circuit 7 detects that the power supply turns on, and the NAND flash memory 100 starts (S801).

On receiving an output signal from the power-on detection circuit 7, the state machine 4 reads various initial setting data held in an initial setting data region of the memory cell array 14, and data including a defective column address known in advance by a test before the shipping. Various initial setting data is set in a register for the initial setting data, and the defective column address data is written to the column separation data holding circuit 19 (S802).

Next, the data latch LAT2 for each page unit is initialized into first data, for example, "0" data (a erased state) (S803).

When end of the initializing operation is informed to the memory controller 200, the memory controller 200 inputs a defective column information output command into the NAND flash memory 100 to start the defective column information output operation (S804).

Subsequently, the data of the data latch LAT2 is read via the complementary data lines DL, DLn (S805). Here, data read into the NAND flash memory 100 via the complementary data lines DL, DLn is second data. In the present embodiment, it is constituted that when the FUSEDATA signal indicates "0", that is, the column is normal, the same "0" data as the data held in the data latch LAT2 is read as the second data.

On the other hand, when the FUSEDATA signal indicates "1", that is, the column is defective, the complementary data lines DL, DLn are separated from the data latch LAT2, and the data fixed by the decoder circuit DEC2 can be output. In the present embodiment, it is constituted that, for example, "1" data is read as the second data.

That is, when the second data read from the NAND flash memory 100 via the complementary data lines DL, DLn is the same "0" data as the first data "0" held in the data latch LAT2, the memory controller 200 recognizes that the column is a normal column. When the second data is "1" data, the memory controller 200 recognizes that the column is the defective column (S806).

When the column is the defective column, a defective column management table to be managed by the defect address management block 26 in the memory controller 200 is updated (S807).

When the column is not the defective column, or when the column is the defective column and the defective column management table to be managed by the defect address management block 26 is updated, it is judged whether or not the column address is a final column address (S808). When the column is not the final column, the column address is incremented by the address counter to continue the defective column information output operation. When the judgment of all the columns ends, the NAND flash memory 100 ends the defective column information output operation (S809).

As described above, the defective column information output operation is performed subsequently to the initial setting operation of the NAND flash memory 100, whereby the memory controller 200 recognizes the defective column address, and can manage the defective column based on this information.

The memory controller 200 constitutes the internal defect address management block 26 based on the informed information to exclude a write data load with respect to the defective column or input invalid data. In reading of the data from the defective column, control is performed so that the read data is discarded, or any data is not read from the column.

Moreover, in the defective column, the initial state of the data latch LAT2 is beforehand set to the data so that any column defect is avoided. In consequence, an influence of the column defect on the device operation can be minimized even during the write, read or erase operation.

Examples of the column defect include a column leak defect and a column open defect. These defects can be detected, for example, by the above-mentioned defect check after the shipping. Alternatively, when occurrence of only one of the column leak defect and the column open defect is dominant, the data latch LAT2 may accordingly beforehand be set to the data so that the dominant defects are avoided.

Figure 9:
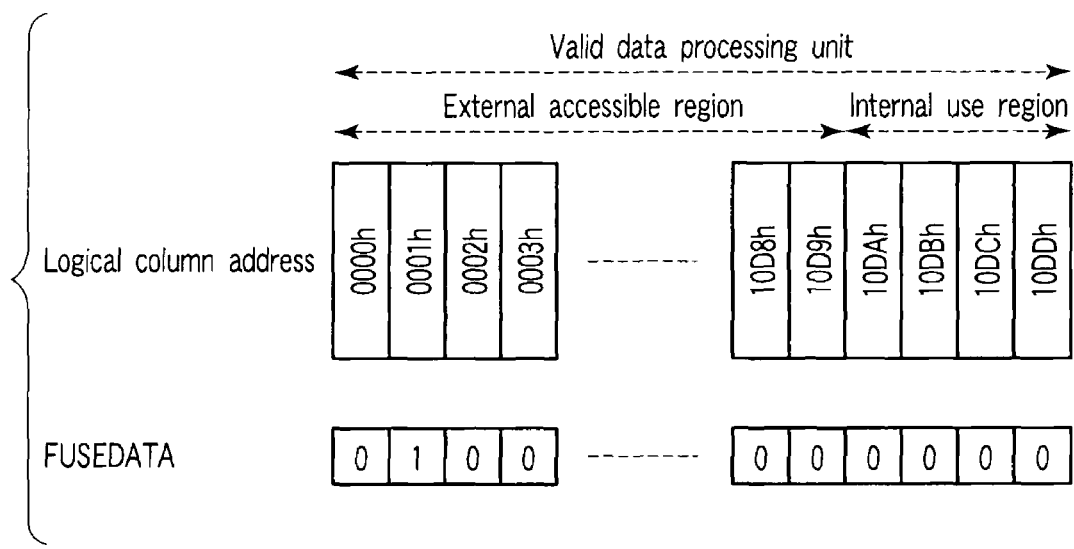
FIG. 9 is a schematic diagram showing a defect management system within a page in the nonvolatile semiconductor storage system according to the first embodiment of the present invention.

FIG. 9 is a schematic diagram showing a defect management system within a page in the nonvolatile semiconductor storage system according to the first embodiment of the present invention. Logical column addresses in a page are divided into two regions, that is, an external accessible region (a first data region) where the data can be input/output between the region and the outside of the NAND flash memory 100, and an internal use region (a second data region) where various pieces of information such as write management information (for example, flag information for use in a multi-value write operation) and protection information are held in or read from the device.

The number of the logical column addresses constituting one page as a valid data processing unit (a collective processing unit) in the write and read operations in the NAND flash memory 100 is constituted of the sum of the addresses of these regions. Here, the valid data processing unit does not include a region (e.g., a dummy region or the like) which can electrically be connected to the outside, but in or from which data cannot be written or read.

FIG. 9 shows a case where a defective column is present in, for example, a logical column address 0001h of the external accessible region. This defective column information is informed to the memory controller 200 and managed in the defect address management block 26.

Moreover, FIG. 10 is a schematic diagram showing a defect management system within a page, in which a part of the system of FIG. 9 is modified. Logical column addresses in a page are divided into an external accessible region, an internal use region, and a redundant region (a third data region) for exclusive use in the internal use region, and the number of the logical column addresses constituting one page as a valid data processing unit is constituted of the sum of the addresses of these regions.

The internal use region has a small number of bytes, for example, about four bytes. However, there is high possibility that the region holds important data having an influence on an operation state. For example, in FIG. 10, although a defective column is present in a logical column address 10DBh of the internal use region, it is preferable that such a defective column is not present in the internal use region.

To this end, in the internal use region, redundant column repair (flexible column redundancy) by use of a conventional address comparison system is not carried out, but it is judged based on a flag signal of one bit whether the internal use region or the redundant region for exclusive use in the internal use region is used. For example, FIG. 10 shows a case where the logical column address 10DBh of the internal use region is replaced with an address CRD1 of the redundant region for exclusive use in the internal use region.

Moreover, the redundant regions for exclusive use in the internal use regions do not have to be necessarily provided as many as the internal use regions. That is, the number of the redundant regions for exclusive use in the internal use regions may appropriately be set to the number of the internal use regions or less.

Furthermore, the internal use region is usually accessed at a rate lower than that of data input/output in terms of cycle time (e.g., the former is a 30 ns cycle, the latter is a 100 ns cycle). Therefore, the redundant region for exclusive use in the internal use region may have a circuit which holds addresses in a defective column address register and which compares accesses to the columns every time required, to change an access destination according to the comparison result. That is, it suffices to realize a high-rate operation in a region from which the data is output to outside of the device or into which the data is input from outside.

As described above, in the nonvolatile semiconductor storage system according to the present embodiment, a simple structure is added to the NAND flash memory 100 constituting the system. On the other hand, a part or all of the redundant column repair system is removed, whereby the cost-performance of the nonvolatile semiconductor storage system is improved, and one factor which disturbs the high-rate operation can be eliminated. Furthermore, a storage capacity larger than before can be provided to a user.

Figure 11:
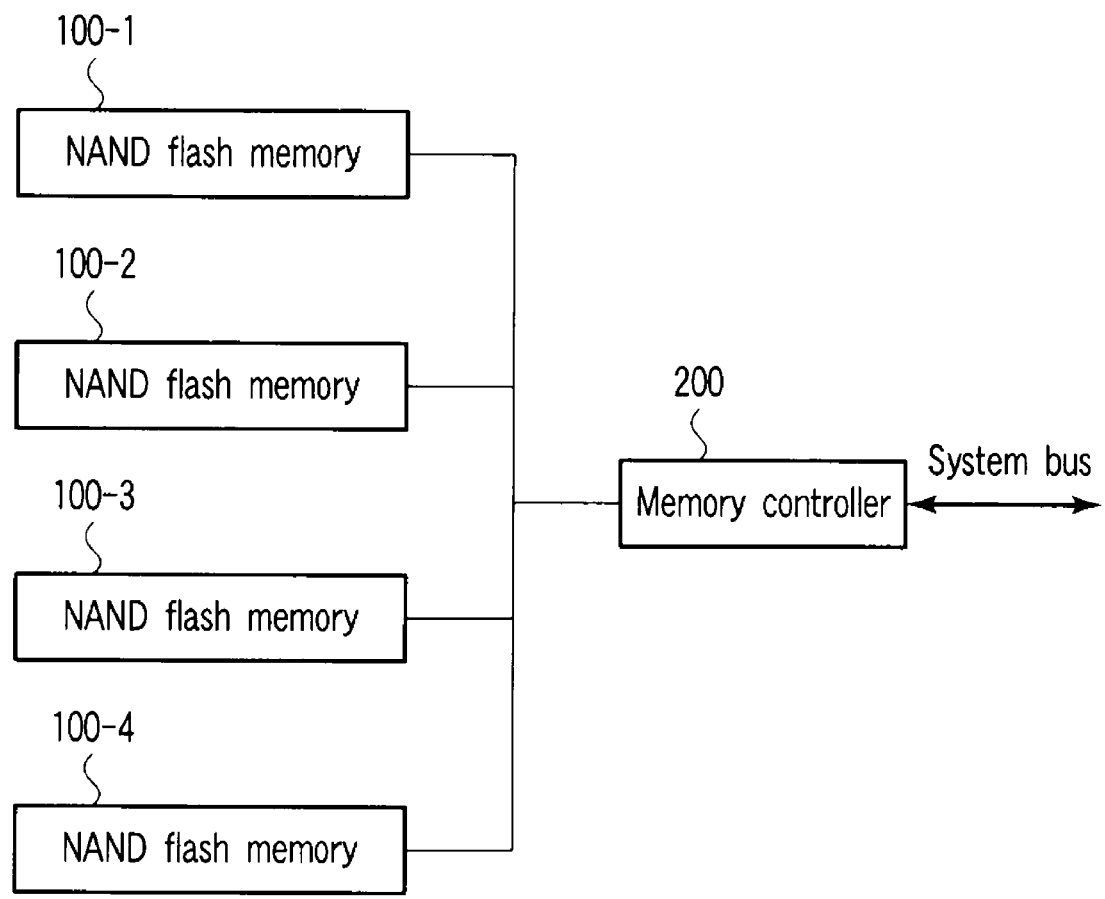
FIG. 11 is a block diagram showing another structure of the nonvolatile semiconductor storage system according to the first embodiment of the present invention.

Moreover, the nonvolatile semiconductor storage system according to the present embodiment may similarly be constituted even when one memory controller 200 controls a plurality of (e.g., four) NAND flash memories 100 as shown in FIG. 11.

Furthermore, in the nonvolatile semiconductor storage system according to the present embodiment, the defective column information output operation is performed at the time of starting the NAND flash memory 100, however, the present invention is not limited to this embodiment. The operation may be started, when a predetermined command is input from the memory controller 200.

In addition, the nonvolatile semiconductor storage system according to the present embodiment may be incorporated in the memory card when used, or may be for use in a mixed application as memory macro.

Moreover, each memory cell MC may have a structure in which a floating gate electrode made of polysilicon is used as a charge accumulation layer, or a structure in which electrons are trapped in a silicon nitride film of an ONO film formed of a silicon oxide, silicon nitride and silicon oxide film.

Furthermore, when an amount of information which can be held in one memory cell increases to eight values, 16 values or the like, a plurality of latch circuits are further required in addition to the sense amplifier circuit 11 in the present embodiment. Even in this case, the structure of the present embodiment can similarly be applied.

Moreover, in the nonvolatile semiconductor storage system according to the present embodiment, it has been described that each page buffer PB provided in the sense amplifier circuit 11 is selectively connected to one of the even-numbered bit line BLe and the odd-numbered bit line BLo via the selection circuit 15, however, the present invention is not limited to this embodiment. The circuit may be constituted so that one bit line BL corresponds to one page buffer PB.

It is to be noted that this invention is not limited to the present embodiment, and a method for carrying out the invention can be modified without departing from the scope of the invention.

Second Embodiment

Figure 12:
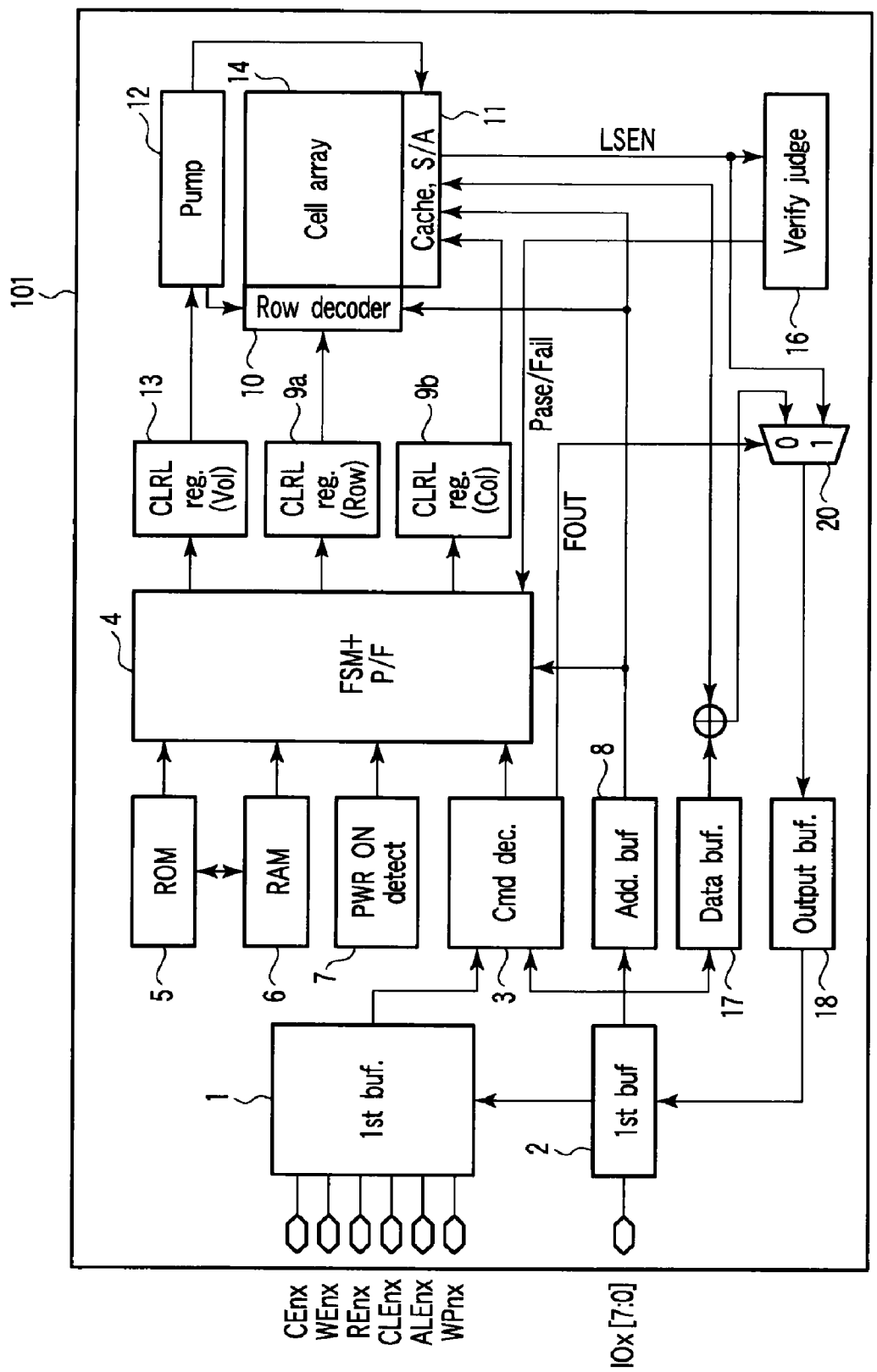
FIG. 12 is a block diagram showing a structure of a NAND flash memory in a nonvolatile semiconductor storage system according to a second embodiment of the present invention.

FIG. 12 is a block diagram showing a functional block structure of a NAND flash memory 101 according to a second embodiment of the present invention. Substantially the same constituting elements as those of the first embodiment will hereinafter be denoted with the same reference numerals, and an only characteristic part of the present embodiment will be described.

In the NAND flash memory 101 according to the present embodiment, a selector circuit 20 is disposed in an output signal path from the sense amplifier circuit 11 to the output buffer circuit 18. The selector circuit 20 switches an output based on information informed from a command decoder 3 to read out information of the third detection line LSEN.

An output structure to the third detection line LSEN is shown in FIG. 13. FIG. 13 shows a structure of the sense amplifier circuit 11 constituting one page. In the present embodiment, the sense amplifier circuit 11 comprises a decoder circuit DEC3. The decoder circuit DEC3 controls the gate of the NMOS transistor Q46 to transmit an FUSEDATA signal to the third detection line LSEN. The drain of the NMOS transistor Q46 is connected to the NMOS transistor Q45 and the source of the NMOS transistor Q46 is connected to ground potential Vss.

The decoder circuit DEC3 has, for example, an NAND circuit DEC3A and an inverter circuit DEC3B, and is constituted so that an output signal of the NAND circuit DEC3A is input into the inverter circuit DEC3B. An activation signal DEN transferred from a control register 9b and a column select signal CSLi output from a decoder circuit DEC4 are input into the NAND circuit DEC3A.

Figure 14:
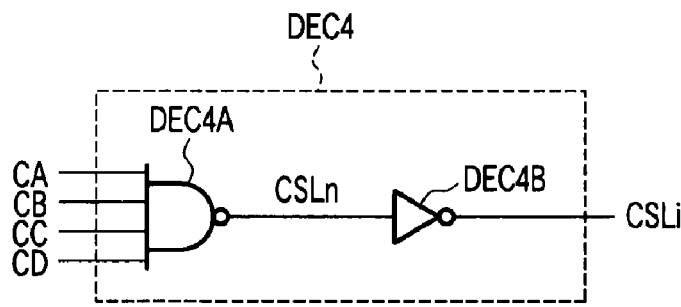
FIG. 14 is a circuit diagram showing a decoder circuit of the NAND flash memory in the nonvolatile semiconductor storage system according to the second embodiment of the present invention.

As shown in FIG. 14, the decoder circuit DEC4 has, for example, an NAND circuit DEC4A and an inverter circuit DEC4B, and is constituted so that an output signal CSLn of the NAND circuit DEC4A is input into the inverter circuit DEC4B. A column address pre-decode signal transferred from an address buffer 8 is input into the NAND circuit DEC4A.

Moreover, a PMOS transistor Q47 controlled by the activation signal DEN transferred from the control register 9b is connected to a source side of the PMOS transistor Q43, and the transistor Q43 is connected to a power source potential Vdd regardless of a state of a first detection line COM during a defective column information output operation.

In consequence, the FUSEDATA signal only in a column address selected based on column address pre-decode signals CA, CB, CC and CD generated by an address counter in an address buffer 8 is transmitted to the third detection line LSEN. Information transmitted to the third detection line LSEN is informed to a memory controller 200 via the selector circuit 20 and the output buffer 18.

Figure 15:
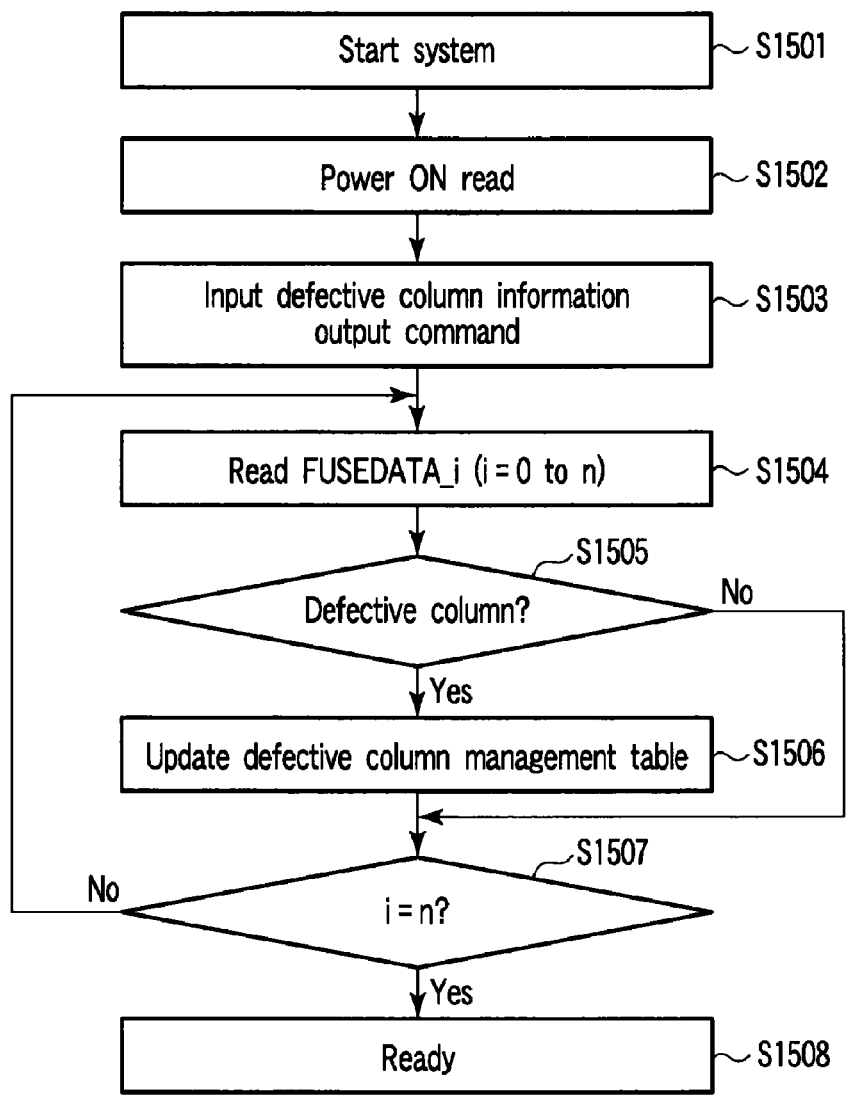
FIG. 15 is a circuit diagram showing a defective column detection sequence of the NAND flash memory in the nonvolatile semiconductor storage system according to the second embodiment of the present invention.

In the semiconductor storage system according to the present embodiment, defective column information is informed to the memory controller 200 in the following sequence by use of the above-mentioned structure and operation at the time of starting the semiconductor storage system. This will be described with reference to FIG. 15. FIG. 15 is a flow chart showing the defective column information output operation.

First, when power is supplied to the semiconductor storage system, a power-on detection circuit 7 detects that power supply turns on, and the NAND flash memory 101 starts (S1501). Upon receipt of an output signal from the power-on detection circuit 7, a state machine 4 reads various initial setting data held in an initial setting data region of the memory cell array 14, and data including a defective column address known in advance by a test before the shipping. Various initial setting data is set in a register for the initial setting data, and the defective column address data is written to a column separation data holding circuit 19 (S1502).

When end of the initializing operation is informed to the memory controller 200, the memory controller 200 inputs a defective column information output command into the NAND flash memory 101 to start the defective column information output operation (S1503).

On receiving the command, the NAND flash memory 101 starts the defective column information output operation.

Subsequently, the FUSEDATA signal held in the column separation data holding circuit 19 is read out via the third detection line LSEN (S1504). In this case, the selector circuit 20 is set to a "1" state based on a signal FOUT input from the command decoder 3, and switched so that the FUSEDATA signal transmitted to the third detection line LSEN is transferred to an output buffer 18.

When the FUSEDATA signal indicates "0", the column is normal. On the other hand, when the signal indicates "1", the column is defective. Therefore, it is judged based on the FUSEDATA signal whether or not the column is the defective column. It is to be noted that during the defective column information output operation, the NMOS transistor Q46 and the PMOS transistor Q47 are always turned on in accordance with the activation signal DEN (S1505).

For example, when the FUSEDATA signal indicates "0" (the normal column), the PMOS transistor Q43 turns on. At this time, the PMOS transistor Q47 turns on in response to the activation signal DEN, so that a second detection line NCOM transits to a logical high based on the power source potential Vdd. Therefore, the NMOS transistor Q45 turns on, and the third detection line LSEN is discharged via the NMOS transistor Q46 turned on in response to the activation signal DEN.

On the other hand, when the FUSEDATA signal indicates "1" (the defective column), the PMOS transistor Q43 turns off. Therefore, the logical level of the second detection line NCOM does not change, and the NMOS transistor Q45 turns off. Therefore, the third detection line LSEN is not discharged via the NMOS transistor Q46.

The memory controller 200 detects such level transition of the third detection line LSEN via the selector circuit 20 and the output buffer 18, whereby it can be judged whether or not the column is the defective column.

When the column is the defective column, information of a defective column address management table is updated (S1506). When the column is not the defective column, or when the column is the defective column and the defective column address information is held in a defect address management block 26, it is judged whether or not the column address is a final column address (S1507). When the column is not the final column, the column address is incremented by the address counter to continue the defective column information output operation. When the judgment of all the columns ends, the NAND flash memory 101 ends the defective column information output operation (S1508).

As described above, the defective column information output operation is performed subsequently to the initial setting operation of the NAND flash memory 101, whereby the memory controller 200 recognizes the defective column address, and can manage the defective column based on this information.

Even in the nonvolatile semiconductor storage system according to the present embodiment, advantages similar to those of the first embodiment can be obtained. The other respects are similar to those of the first embodiment.

Third Embodiment

FIG. 16 is a block diagram showing a functional block structure of a NAND flash memory associated with column separation data output, according to the third embodiment of the present invention. Constituent elements substantially identical with those of the first and second embodiments are denoted by the same reference symbols as those of the first and second embodiments, and only parts characteristic of the present embodiment will be mainly described in the following explanation of the present embodiment.

A sense amplifier circuit 11 is constituted of a plurality of sense amplifier units having the same constitution, and each sense amplifier unit, for example, a sense amplifier unit 11-0, is constituted of a column separation data holding circuit 301, a data buffer 302 of one byte for at least one column address, a plurality of sense amplifier circuits 303, an address decoder circuit 304, and a bus selection circuit 305.

In this embodiment, data read by the sense amplifier circuit 303 is input to the data buffer 302, and is also input to the bus selection circuit 305. A FUSEDATA signal is also input to the bus selection circuit 305 from the column separation data holding circuit 301. The bus selection circuit 305 selects and outputs the data read by the sense amplifier circuit 303 or the FUSEDATA signal input from the column separation data holding circuit 301, in accordance with a command from a command decoder 3.

The data selected by bus selection circuit 305 is read out on an output bus OUTBUS via an output buffer controlled by an output signal OUT0 of an address decoder circuit 304 for decoding address pre-decode signals CA, CB, CC, and CD transferred from an address buffer 8 or an output signal generated in association with the address pre-decode signals CA, CB, CC, and CD, and output to an output pad IOx. The pre-decode address signals CA, CB, CC, and CD transferred from the address buffer 8 are input to an output buffer of each sense amplifier unit in common. Data selected by bus selection circuit 305 is read out from a selected sense amplifier unit onto the output bus OUTBUS, and output to the output pad. In this embodiment, a constitution in which each sense amplifier unit holds data of 8 bytes is exemplified. However, the embodiment is not limited to this constitution.

FIG. 17 shows a structural example of the column separation data holding circuit 301 used in the third embodiment of the present invention.

As shown in FIG. 17, the column separation data holding circuit 301 is constituted of a latch circuit formed by reverse connecting an inverter and a NAND logical circuit in parallel. The column separation data holding circuit 301 has substantially the same function as the column separation data holding circuit 19 shown in each of the first and second embodiments.

More specifically, the column separation data holding circuit 301 functions to exclude a defective column or the like from the target of the verification judgment, and defective column separation data is written into the column separation data holding circuit 301 in accordance with a result of a test performed before shipment. That is, column separation data held in an initial setting data storage region of the memory cell array 14 is read when power is turned on, and is written in the column separation data holding circuit 301.

Further, the data held in the column separation data holding circuit 301 is configured to be rewritable by a command input from outside of the NAND flash memory 100 to exclude a defective column occurring during the use of the NAND flash memory 100 after shipment from the target of the verification judgment.

Specifically, when power is turned on, a reset signal RSTn input to the NAND logical circuit in the column separation data holding circuit 301 is set to "0" so that FUSEDATA signal is initialized to "0", and thereafter the FUSEDATA signal is set at a predetermined logical level in accordance with a predetermined sequence.

In order to enable this rewriting, an NMOS transistor Q61 controlled by a column selection signal TRSi and an NMOS transistor Q62 controlled by an activation signal ISET are connected in series between one data node N51 of the column separation data holding circuit 301 and the ground potential Vss as shown in FIG. 17. Further, the other node N52 is connected to a gate of an NMOS transistor Q63 controlled by FUSEDATA signal from the column separation data holding circuit 301.

A source of the NMOS transistor is connected to the ground potential Vss. An NMOS transistor Q64 controlled by the column selection signal TRSi output from the decoder circuit 304 is connected between a drain of the NMOS transistor Q63 and a local bus ISOBUS.

When a defective column is newly found by a defect check performed in accordance with a predetermined sequence after shipment, in order to exclude the newly found defective column from the verification judgment target, the NMOS transistor Q61 is turned on by setting the column selection signal TRSi at "1", and the NMOS transistor Q62 is turned on by setting the activation signal ISET at "1", thereby setting the data node N51 of the column separation data holding circuit 301 at "0", and setting the data node N52 thereof at "1".

As a result of this, FUSEDATA signal from the column separation data holding circuit 301 is set at "1". FUSEDATA signal from the column separation data holding circuit 301 is output to the local bus ISOBUS via the NMOS transistor Q63 selected by the column selection signal TRSi. As a result, the corresponding column is excluded from the verification judgment target as a defective column.

The column selection signal TRSi<7:0> used when FUSEDATA signal is selectively output to the local bus ISOBUS is produced by the decoder circuit DEC304. Incidentally, the column selection signal TRSi<7:0> is also used as a signal for selecting a plurality of data buffers 302 arranged in the sense amplifier unit.

FIG. 18 shows the constitution of the decoder circuit DEC304 in a block diagram. The decoder circuit DEC304 generates the column selection signal TRSi (In FIG. 18, there is shown a case where i=0) for accessing a column address indicated by an address counter on the basis of column address pre-decode signals CA, CB, CC, and CD input via a plurality of bus lines (four lines in this embodiment).

Specifically, the decoder circuit DEC304 comprises eight decoder units for receiving the column address pre-decode signals CA, CB, CC, and CD in common, and each of the eight decoder units generates a column selection signal TRSi for selecting a corresponding column.

The decoder circuit DEC304 also comprises a decoder unit for receiving the column address pre-decode signals CB, CC, and CD, and generates a signal OUTi for permitting data held in the output buffer which is input thereto from the bus selection circuit 305 to be output from the output buffer. The signal OUTi indicates output permission during a period for which the sense amplifier unit is selected.

In the sense amplifier circuit 11 shown in FIG. 16, when data is output from the 0th sense amplifier unit 11-0, the signal OUT0 is activated, and signals OUTi (i≠0) from the other sense amplifier units are inactivated. Further, when data is output from the first sense amplifier unit 11-1, the signal OUT1 is activated and signals OUTi (i≠1) from the other sense amplifier units are inactivated. When data is output from a sense amplifier of a later ordinal number, the situation is the same as above, i.e., when data is output from a k-th sense amplifier unit, the signal OUTk is activated, and signals OUTi (i≠k) from the other sense amplifier units are inactivated. In the manner described above, output collision is prevented from occurring.

FIG. 19 shows a structural example of the data buffer 302 in a case where a bus width of the data buffer selected by the column selection signal TRSi signal is 8 bits. The data buffer 302 is constituted of a register circuit and a transfer gate circuit. The data buffer 302 holds read data and write data or internal data or the like necessary for the operation of the NAND flash memory, and, as the need arises, performs a predetermined operation in accordance with a signal indicated by a control register (not shown in FIG. 19) in the peripheral circuits.

FIG. 20 shows a structural example of the bus selection circuit 305.

The bus selection circuit 305 outputs information on DATABUS<7:0> when a signal CMD_ISOOUT informed from the command decoder 3 is at "0", and on the other hand, outputs information on the local bus ISOBUS when the signal CMD_ISOOUT informed from the command decoder 3 is at "1". In this embodiment, when the signal CMD_ISOOUT is at "1", the local bus ISOBUS is connected to one output bus OUTBUS<7:0>, and "0" is output from the other output bus OUTBUS<7:0>. However, the embodiment is not limited to this constitution.

As a result, FUSEDATA signal only in a column address selected by a column address decoder (not shown) is informed from an output buffer 18 to a memory controller 200 via an internal bus.

Further, in the semiconductor storage system to which the present embodiment is applied, the defective column information is informed at the time of starting to the memory controller 200 in accordance with a sequence described in FIG. 15, by utilizing the means, constitution, and the operation described previously. As a result of this, the memory controller 200 recognizes the defective column address, and it becomes possible for the memory controller to perform defective column management on the basis of the information.

Incidentally, unlike the first and second embodiments that are each applied to a memory cell array in which bit lines of odd numbers and bit lines of even numbers are distinguished from each other, the third embodiment is applied to a memory cell array in which bit lines of odd numbers and bit lines of even number are not distinguished from each other.

FIG. 21 is a block diagram of a memory cell array and a peripheral circuit including a sense amplifier circuit used in the nonvolatile semiconductor storage system according to the third embodiment of the present invention;

As shown in FIG. 21, the bit lines BL1, BL2, BL3, ... BLn are not distinguished as to whether these bit lines are odd-numbered bit lines or even-numbered bit lines, and each of the bit lines is provided with one corresponding sense amplifier S/A. Accordingly, unlike the first and second embodiments, a selection circuit for selecting bit lines by distinguishing odd-numbered bit lines and even-numbered bit lines from each other (for example, the selection circuit 15 in FIG. 3) is not provided.

FIG. 22 shows a schematic structure in the sense amplifier circuit 11 shown in FIG. 21. As shown in FIG. 22, the sense amplifier circuit 11 has a constitution in which sense amplifiers S/An−2, S/An−1, S/An, S/An+1, and S/An+2 are each connected to bit lines BLn−2, BLn−1, BLn, BLn+1, and BLn+2, respectively. Incidentally, in FIG. 22, sense amplifiers S/As for five circuits are shown. However, the sense amplifier 11 actually has a constitution in which all of the bit lines BL1 to BLm shown in FIG. 21 are provided with and connected to sense amplifieres S/As in one-to-one form.

Next, a circuit structure of the sense amplifier S/A shown in FIG. 21 for one circuit is shown in FIG. 23. As shown in FIG. 23, the sense amplifier S/A includes a precharge circuit 401, a clamp circuit 402, a BL reset circuit 403, a sense circuit 404, a sense circuit 404, a data latch circuit 405, an NMOS transistor TR1 having a high breakdown voltage, and NMOS transistors TR10 and TR13.

The precharge circuit 401 is constituted of PMOS transistors TR2 and TR3. In the PMOS transistor TR2, the source terminal is connected to a power supply terminal, the gate terminal is connected to an FLT input terminal, and the drain terminal is connected to the source terminal of the PMOS transistor TR3. In the PMOS transistor TR3, the gate terminal is connected to an INV input terminal, the drain terminal is connected to the clamp circuit 402. The precharge circuit 401 is a circuit which is operated by a voltage signal FLT input thereto from an external control circuit or the like (not shown) and a voltage signal INV generated by inside the device, and controls a precharge operation for bit lines BL and the sense circuit 404 to be described later.

The clamp circuit 402 is constituted of NMOS transistors TR4 to TR7. In the NMOS transistor TR4, the source terminal is connected to the precharge circuit 401, the gate terminal is connected to a BLX input terminal, and the drain terminal is connected to the source terminal of the NMOS transistor TR5. In the NMOS transistor TR5, the gate terminal is connected to a BLC input terminal, and the drain terminal is connected to the BL reset circuit 403.

In the NMOS transistor TR6, the source terminal is connected the precharge circuit 401, the gate terminal is connected to an HLL input terminal, and the drain terminal is connected to the source terminal of the NMOS transistor TR7 and the sense circuit 404. In the NMOS transistor TR7, the gate terminal is connected to an XXL input terminal, and the drain terminal is connected to the source terminal of the NMOS transistor TR10.

Further, the source terminals of the NMOS transistors TR4 and TR7 are connected to each other by a node COM. The clamp circuit 402 is a circuit which is operated by voltage signals BLX, BLC, HLL, and XXL input thereto from the external control circuit or the like (not shown), and sets a precharge voltage to be supplied to the bit lines BL and the sense circuit 404 to be described later.

The BL reset circuit 403 is constituted of NMOS transistors TR8 and TR9. In the NMOS transistor TR8, the source terminal is connected to the clamp circuit 402, the gate terminal is connected to an INV input terminal, and the drain terminal is connected to the source terminal of the NMOS transistor TR9. In the NMOS transistor TR9, the gate terminal is connected to a GRS input terminal, and the drain terminal is connected to the ground. The BL reset circuit 403 is a circuit which is operated by a voltage signal GRS input thereto from the external control circuit or the like (not shown) and a voltage signal INV generated inside the device, and resets the charged voltage of the bit lines BL before the data write operation is performed with respect to the memory cell.

The sense circuit 404 is constituted of PMOS transistors TR11 and TR12, and a capacitor C_SEN. In the PMOS transistor TR11, the source terminal is connected to a power supply terminal, the gate terminal is connected to an STB input terminal, and the drain terminal is connected to the source terminal of the PMOS transistor TR12. In the PMOS transistor TR12, the gate terminal is connected to the capacitor C_SEN and the clamp circuit 402, and the drain terminal is connected to the source terminal of the NMOS transistor TR13 and the data latch circuit 405.

In the capacitor C_SEN, one terminal thereof is connected to a node SEN, and the other terminal thereof is connected to the ground. The sense circuit 404 is a circuit which is operated by a voltage signal STB input thereto from the external control circuit or the like (not shown) and a precharge voltage supplied from the clamp circuit 402, and senses data stored in the memory cell connected to the bit lines BL.

The data latch circuit 405 is constituted of PMOS transistors TR14 to TR16, and NMOS transistors TR17 to TR19. In the PMOS transistor TR14, the source terminal is connected to a power supply terminal, the gate terminal is connected to an RST input terminal, and the drain terminal is connected to the source terminal of the PMOS transistor TR15. In the PMOS transistor TR15, the gate terminal is connected to the drain terminal of the PMOS transistor TR16 and the gate terminal of the NMOS transistor TR17, and the drain terminal is connected to the source terminal of the NMOS transistor TR17.

In the PMOS transistor TR16, the source terminal is connected to a power supply terminal, the gate terminal is connected to the drain terminal of the PMOS transistor TR15 and the gate terminal of the NMOS transistor TR19, and the drain terminal is connected to the source terminal of the NMOS transistor TR19. In the NMOS transistor TR17, the drain terminal is connected to the source terminal of the NMOS transistor TR18. In the NMOS transistor TR18, the gate terminal is connected to an STB input terminal, and the drain terminal is connected to the ground.

Further, the drain terminal of the PMOS transistor TR15, the gate terminal of the PMOS transistor TR16, and the gate terminal of the NMOS transistor TR19 are connected to a node INV. In the NMOS transistor TR19, the drain terminal is connected to the ground. The data latch circuit 405 is a circuit which operates in accordance with the potential of each of a voltage signal RST and the node INV input thereto from the external control circuit or the like (not shown), and latches data sensed by the sense circuit 404.

In the NMOS transistor TR10, the source terminal is connected to the clamp circuit 402, the gate terminal is connected to an NCO input terminal, and the drain terminal is connected to the BUS. The NMOS transistor TR10 is a transistor which operates in accordance with a voltage signal NCO input thereto from the external control circuit or the like (not shown), and is used to input and output data.

In the NMOS transistor TR13, the source terminal is connected to the node INV, the gate terminal is connected to an RST input terminal, and the drain terminal is connected to the ground. The NMOS transistor TR13 is a transistor which operates in accordance with a voltage signal RST input thereto from the external control circuit or the like (not shown), and resets the potential of the node INV.

Fourth Embodiment

Figure 24:
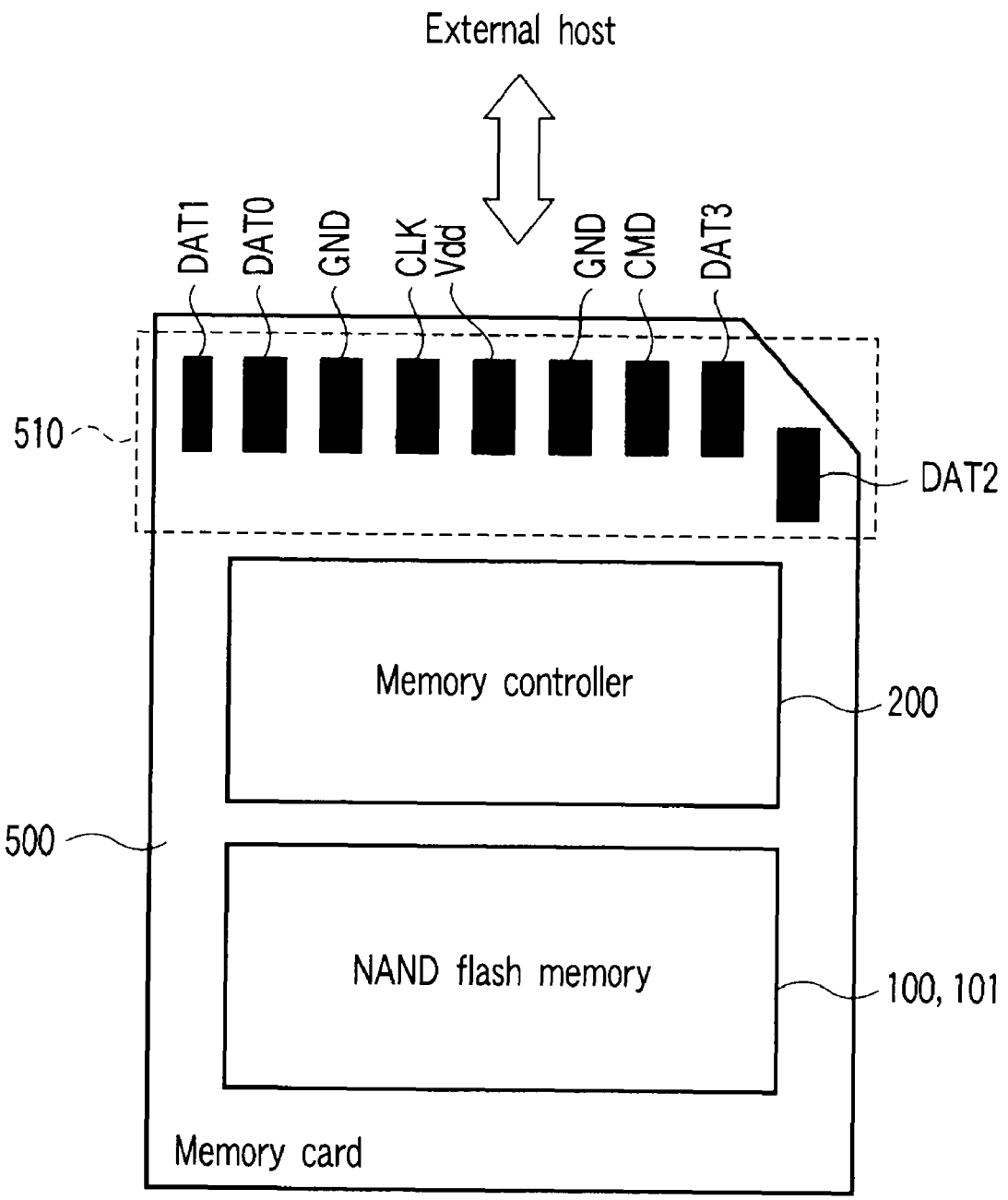
FIG. 24 is a block diagram showing a structure of a memory card according to a fourth embodiment of the present invention.

FIG. 24 is a block diagram showing a structure of a memory card 500 according to a fourth embodiment of the present invention. The memory card 500 has therein a nonvolatile semiconductor storage system according to the first, second or third embodiment described above.

The memory card 500 is formed into an SDTM memory card-like appearance having, for example, a group of nine terminals, and used as a type of external storage device with respect to an external host apparatus or the like (not shown). Specific examples of the external host apparatus include various electronic apparatuses such as a personal computer which processes various data including image data, music data and ID data, a PDA, a digital still camera and a cellular phone.

In a signal terminal 510 for an interface, nine signal terminals in total are arranged, the terminals including a CLK terminal for use in clock transfer from the external host apparatus to the memory card 500, a CMD terminal for use in transferring a command or a response to the command, DAT0, DAT1, DAT2 and DAT3 terminals for use as input/output terminals of data to be read or written, a Vdd terminal for use in power supply, and two GND terminals for use in grounding.

These nine signal terminals are electrically connected to a host interface to transmit and receive the command, an address, data and the like.

Fifth Embodiment

Figure 25:
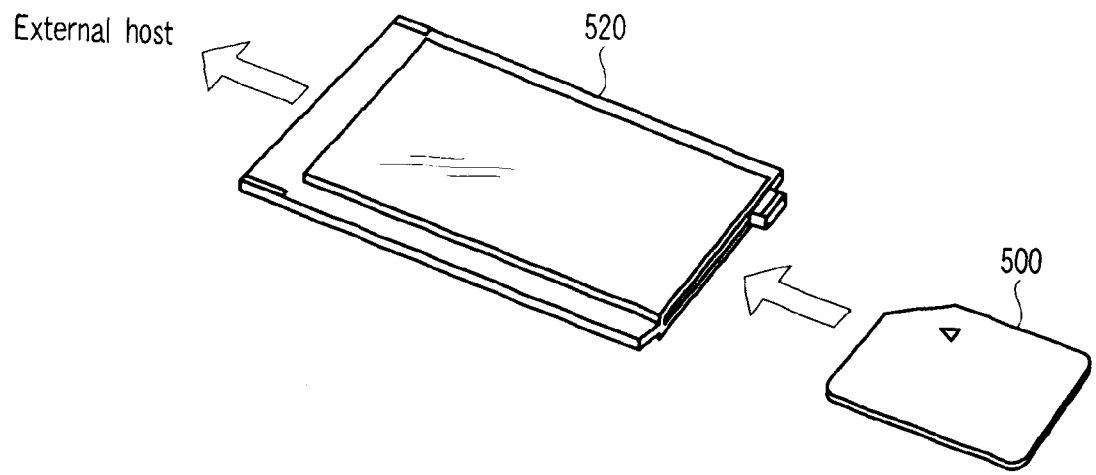
FIG. 25 is a schematic diagram showing a memory card holder according to a fifth embodiment of the present invention.
Figure 26:
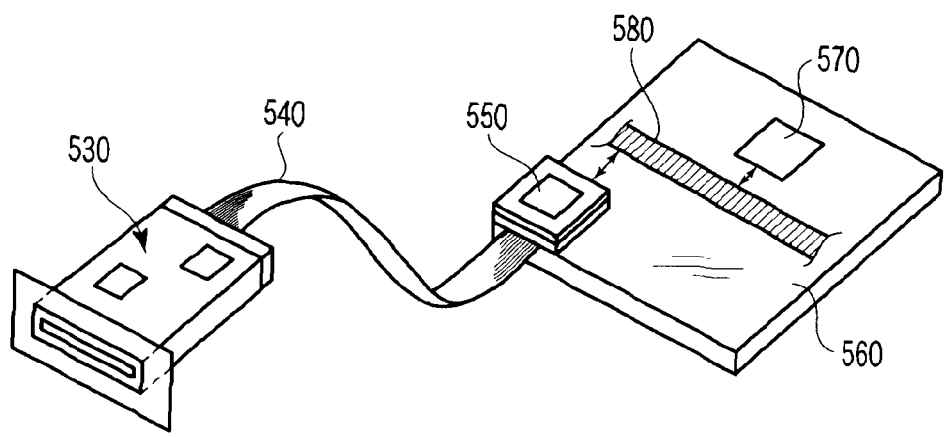
FIG. 26 is a schematic diagram showing a connection device according to a sixth embodiment of the present invention.

FIG. 25 is a schematic diagram showing a memory card holder 520 according to a fifth embodiment of the present invention. The memory card 500 according to the fourth embodiment can be inserted into the memory card holder 520 shown in FIG. 25. The memory card holder 520 is connected to an external host apparatus (not shown), and functions as an interface device between the memory card 500 and the external host apparatus.

Sixth Embodiment FIG. 26 is a schematic diagram showing a connection device 530 according to a sixth embodiment of the present invention.

The connection device 530 can receive both of the memory card 500 and the memory card holder 520 according to the fourth or fifth embodiment. The memory card 500 or the memory card holder 520 is attached to the connection device 530, and electrically connected thereto. The connection device 530 is connected to a board 560 via a connection wire 540 and an interface circuit 550. The board 560 has a CPU 570 and a bus 580.

Seventh Embodiment

Figure 27:
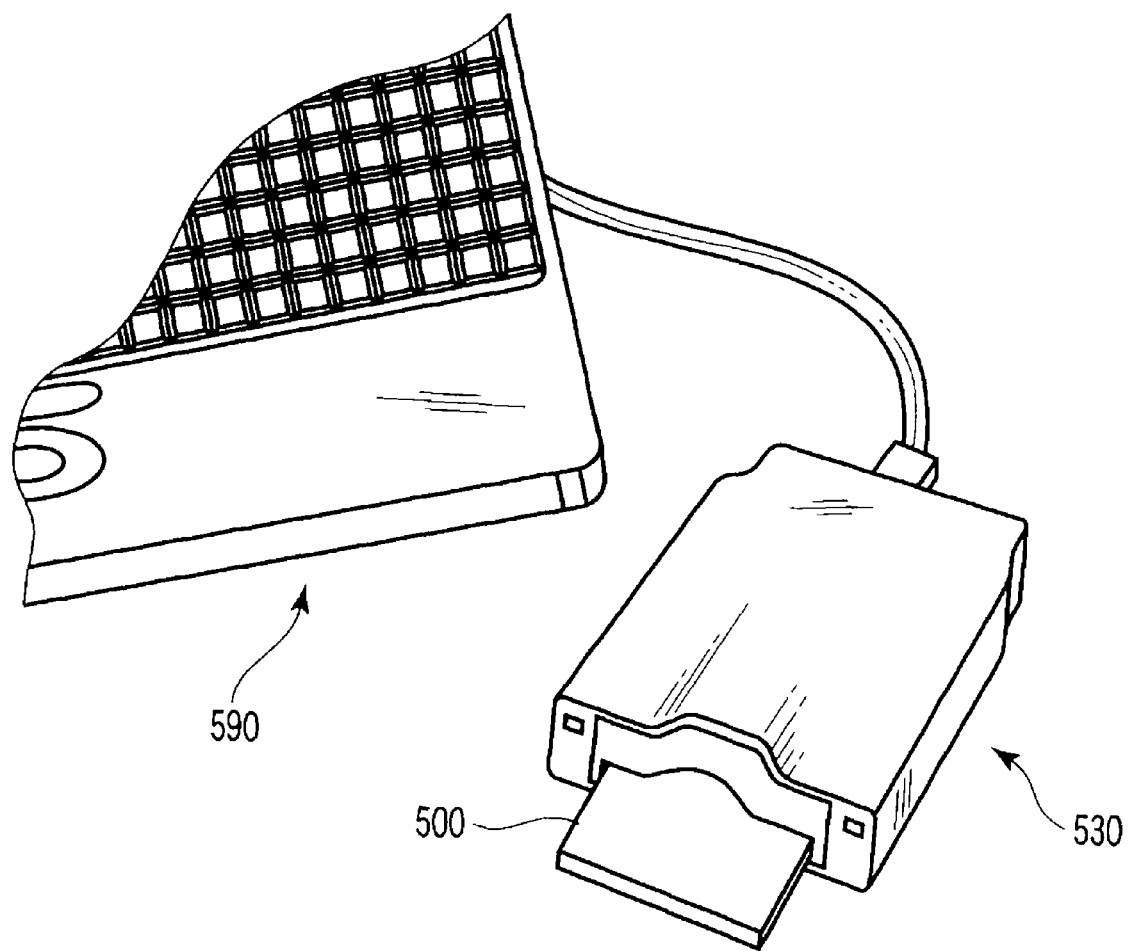
FIG. 27 is a schematic diagram showing the connection device according to the seventh embodiment of the present invention.

FIG. 27 is a schematic diagram showing a connection device according to the seventh embodiment of the present invention.

As shown in FIG. 27, the memory card 500 or the memory card holder 520 may be inserted into the connection device 530, and the connection device 530 may be connected to a PC 590 via the wire 540.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage device comprising:
 a memory cell array in which a plurality of electrically rewritable nonvolatile memory cells are arranged;
 a first data holding circuit which temporarily holds a collective processing unit of read or write data to be simultaneously read from or written to the memory cells;
 a circuit which takes out the data held in the first data holding circuit from the device to outside; and
 a second data holding circuit in which data is changeable based on a command input to the device from outside,
 wherein the collective processing unit is equal to a sum of the number of units used within the device and the maximum number of units continuously output from the device to outside or input to the device from outside.

2. The nonvolatile semiconductor storage device according to claim 1, further comprising a circuit which takes out the data held in the second data holding circuit from the device to outside.

3. The nonvolatile semiconductor storage device according to claim 1, further comprises a data change circuit which changes data output from the device to outside on the basis of the data held in the second data holding circuit, regardless of the data held in the first data holding circuit.

4. The nonvolatile semiconductor storage device according to claim 3, wherein the data change circuit which changes data output from the device to outside includes a selection circuit which selectively outputs the data held in the second data holding circuit from the device to outside on the basis of control information from a command decoder.

5. The nonvolatile semiconductor storage device according to claim 1, further comprises a circuit which holds the data held in the first data holding circuit without changing the data held therein, on the basis of the data held in the second data holding circuit.

6. The nonvolatile semiconductor storage device according to claim 1, wherein the data held in the second data holding circuit is data used, when writing is to be made to a memory cell of a defective column, to electrically separate the defective column from a verification circuit to exclude a verification operation for the defective column.

7. The nonvolatile semiconductor storage device according to claim 1, wherein each of the first data holding circuit and the second data holding circuit is a circuit in units of at least one bit.

8. The nonvolatile semiconductor storage device according to claim 1, further comprising:
 a detection circuitry which is connected between the first data holding circuit and the verification circuit, and includes,
 a first detection circuit which sets a first detection line at a logical level in units of column of one column data held in the first data holding circuit,
 a second detection circuit which selectively transits the logical level to a second detection line on the basis of data held in the second data holding circuit, and
 a third detection circuit which transits the logical level transited to the second detection line to a third detection line connected to the verification circuit in response to a column activation signal.

9. A nonvolatile semiconductor storage device comprising:
 a memory cell array in which a plurality of electrically rewritable nonvolatile memory cells are arranged;
 a first data holding circuit which temporarily holds a collective processing unit of read or write data to be simultaneously read from or written to the memory cells;
 a circuit which takes out the data held in the first data holding circuit to outside of the device; and
 a second data holding circuit in which data is changeable based on a command input from outside of the device,
 wherein the collective processing unit is more than a sum of the number of units used within the device and the maximum number of units continuously output from the device to outside or input to the device from outside and less than a sum of the number of the units used within the device, the maximum number of the units continuously output from the device to outside or input to the device from outside and the number of units of redundant regions which is at most equal in numbers to the number of units used within the device.

10. The nonvolatile semiconductor storage device according to claim 9, further comprising:
 a circuit which takes out the data held in the second data holding circuit from the device to outside.

11. The nonvolatile semiconductor storage device according to claim 9, further comprising:
 a data change circuit which changes data output from the device to outside on the bases of the data held in the second data holding circuit, regardless of the data held in the first data holding circuit.

12. The nonvolatile semiconductor storage device according to claim 11, wherein the data change circuit which changes data output from the device to outside includes a selection circuit which selectively outputs the data held in the second data holding circuit from the device to outside on the basis of control information from a command decoder.

13. The nonvolatile semiconductor storage device according to claim 9, further comprising:

a circuit which holds the data held in the first data holding circuit without changing the data held therein, on the basis of the data held in the second data holding circuit.

14. The nonvolatile semiconductor storage device according to claim 9, wherein the data held in the second data holding circuit is data used, when writing is to be made to a memory cell of a defective column, to electrically separate the defective column from a verification circuit to exclude a verification operation for the defective column.

15. The nonvolatile semiconductor storage device according to claim 9, wherein each of the first data holding circuit and the second data holding circuit is a circuit in units of at least one bit.

16. The nonvolatile semiconductor storage device according to claim 9, further comprising:
- a detection circuitry which is connected between the first data holding circuit and the verification circuit, and includes,
- a first detection circuit which sets a first detection line at a logical level in units of column of one column data held in the first data holding circuit,
- a second detection circuit which selectively transits the logical level to a second detection line on the basis of data held in the second data holding circuit, and
- a third detection circuit which transits the logical level transited to the second detection line to a third detection line connected to the verification circuit in response to a column activation signal.

17. A nonvolatile semiconductor storage device comprising:
- a memory cell array in which a plurality of electrically rewritable nonvolatile memory cells are arranged;
- a first data holding circuit which stores read or write data to be simultaneously read from or written to the memory cells;
- a circuit which takes out the data stored in the first data holding circuit to outside; and
- a second data holding circuit which stores data changeable based on a command input from outside.

18. The nonvolatile semiconductor storage device according to claim 17, wherein the data stored in the second data holding circuit is data used to electrically separate the defective column from a verification circuit to exclude a verification operation for the defective column.

19. The nonvolatile semiconductor storage device according to claim 17, further comprising:
- a data change circuit which changes data output to outside and selectively outputs the data stored in the second data holding circuit to outside on the basis of control information from a command decoder.

20. The nonvolatile semiconductor storage device according to claim 17, wherein the number of the first data holding circuits is equal to the number of the logical column address constituting one page.

* * * * *